(12) United States Patent
Tsuruga et al.

(10) Patent No.: US 8,859,887 B2
(45) Date of Patent: Oct. 14, 2014

(54) PHOTOVOLTAIC DEVICE AND PROCESS FOR PRODUCING PHOTOVOLTAIC DEVICE

(75) Inventors: Shigenori Tsuruga, Kanagawa (JP); Kengo Yamaguchi, Nagasaki (JP); Saneyuki Goya, Kanagawa (JP); Satoshi Sakai, Kanagawa (JP)

(73) Assignee: Mitsubishi Heavy Industries, Ltd., Tokyo (JP)

( * ) Notice: Subject to any disclaimer, the term of this patent is extended or adjusted under 35 U.S.C. 154(b) by 526 days.

(21) Appl. No.: 12/997,418

(22) PCT Filed: Jul. 8, 2009

(86) PCT No.: PCT/JP2009/062429
§ 371 (c)(1),
(2), (4) Date: Jan. 14, 2011

(87) PCT Pub. No.: WO2010/050271
PCT Pub. Date: May 6, 2010

(65) Prior Publication Data
US 2011/0100444 A1     May 5, 2011

(30) Foreign Application Priority Data
Oct. 31, 2008 (JP) ................. 2008-282096

(51) Int. Cl.
*H01L 31/105* (2006.01)
*H01L 31/18* (2006.01)
*H01L 27/142* (2014.01)
*H01L 31/076* (2012.01)
*H01L 31/077* (2012.01)

(52) U.S. Cl.
CPC ........ *H01L 27/1423* (2013.01); *H01L 31/1824* (2013.01); *Y02E 10/547* (2013.01); *Y02E 10/548* (2013.01); *H01L 31/1804* (2013.01); *H01L 31/076* (2013.01); *H01L 31/077* (2013.01); *Y02E 10/545* (2013.01)
USPC .............................. 136/255; 136/252; 438/87

(58) Field of Classification Search
USPC ..................... 136/255, 252; 438/87
See application file for complete search history.

(56) References Cited

U.S. PATENT DOCUMENTS 4,342,044 A * 7/1982 Ovshinsky et al. ............. 257/54
4,492,743 A * 1/1985 Howe ............................ 429/111
(Continued)

FOREIGN PATENT DOCUMENTS

| CN | 101246929 A | 2/2007 |
|---|---|---|
| JP | 62-35680 | 2/1987 |

(Continued)

OTHER PUBLICATIONS

Yoshida et al., JP 62-035680 A English Translation as provided by "The McElroy Translation Company", translated on Nov. 2012.*

(Continued)

*Primary Examiner* — Golam Mowla
(74) *Attorney, Agent, or Firm* — Manabu Kanesaka; Benjamin J. Hauptman

(57) ABSTRACT

A photovoltaic device that exhibits increased open-circuit voltage and an improved fill factor due to an improvement in the contact properties between the n-layer and a back-side transparent electrode layer or intermediate contact layer, and a process for producing the photovoltaic device. The photovoltaic device comprises a photovoltaic layer having a p-layer, an i-layer and an n-layer stacked on top of a substrate, wherein the n-layer comprises a nitrogen-containing n-layer and an interface treatment layer formed on the opposite surface of the nitrogen-containing n-layer to the substrate, the nitrogen-containing n-layer comprises nitrogen atoms at an atomic concentration of not less than 1% and not more than 20%, and has a crystallization ratio of not less than 0 but less than 3, and the interface treatment layer has a crystallization ratio of not less than 1 and not more than 6.

4 Claims, 19 Drawing Sheets

(56) References Cited

U.S. PATENT DOCUMENTS

| | | | |
|---|---|---|---|
| 4,492,810 A * | 1/1985 | Ovshinsky et al. | 136/255 |
| 4,564,533 A * | 1/1986 | Yamazaki | 427/573 |
| 5,324,364 A * | 6/1994 | Matsuda et al. | 136/249 |
| 5,429,685 A * | 7/1995 | Saito et al. | 136/255 |
| 5,439,533 A * | 8/1995 | Saito et al. | 136/258 |
| 5,563,075 A * | 10/1996 | Saito et al. | 438/87 |
| 5,716,480 A * | 2/1998 | Matsuyama et al. | 136/249 |
| 5,913,986 A * | 6/1999 | Matsuyama | 136/255 |
| 6,211,454 B1 * | 4/2001 | Sano | 136/258 |
| 6,399,873 B1 * | 6/2002 | Sano et al. | 136/249 |
| 6,835,888 B2 * | 12/2004 | Sano et al. | 136/249 |
| 6,960,718 B2 * | 11/2005 | Sano et al. | 136/255 |
| 2001/0037824 A1 * | 11/2001 | Sano et al. | 136/255 |
| 2003/0079771 A1 * | 5/2003 | Sano et al. | 136/249 |
| 2003/0205269 A1 * | 11/2003 | Sano et al. | 136/255 |
| 2005/0028860 A1 * | 2/2005 | Sano et al. | 136/249 |
| 2011/0092012 A1 * | 4/2011 | Mashima et al. | 438/87 |

FOREIGN PATENT DOCUMENTS

| | | |
|---|---|---|
| JP | 4-225282 A | 8/1992 |
| JP | 2626653 | 4/1997 |
| JP | 2003-017724 | 1/2003 |
| JP | 2003-158078 A | 5/2003 |
| JP | 2003-347224 A | 12/2003 |
| JP | 2004-128110 A | 4/2004 |
| JP | 2005-277021 | 10/2005 |
| JP | 2006-060131 | 3/2006 |
| JP | 2006-073878 | 3/2006 |
| JP | 2006-120930 | 5/2006 |
| JP | 4032610 | 11/2007 |
| JP | 2009-158667 | 7/2009 |

OTHER PUBLICATIONS

Sugita et al., JP 2006-120930 A English translation as provided by "The Industrial Property Digital Library (IPDL)" (http://www.ipdl.inpit.go.jp/homepg_e.ipdl), translated on Nov. 20, 2012.*
Chinese Office Action for 200980123940.7 issued May 4, 2012.
International Search Report from corresponding PCT Application No. PCT/JP2009/062429.
Notice of Reasons for Refusal issued on Jan. 18, 2011 in corresponding Japanese application No. 2008-282096.
Notification of the Grant of Patent Right as issued on Jan. 17, 2013, for corresponding Chinese Patent Application No. 200980123940.7.
Decision to Grant a Patent issued Jan. 15, 2014, corresponds Taiwanese patent application No. 098127747.

* cited by examiner

FIG. 4
(a)
(b)
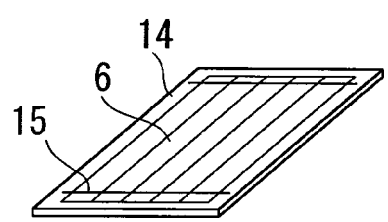
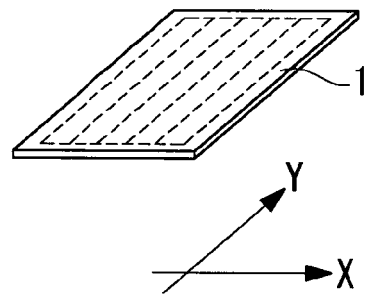

US 8,859,887 B2

PHOTOVOLTAIC DEVICE AND PROCESS FOR PRODUCING PHOTOVOLTAIC DEVICE

RELATED APPLICATIONS

The present application is based on International Application Number PCT/JP2009/062429, filed Jul. 8, 2009, and claims priority from Japanese Application Number 2008-282096, filed Oct. 31, 2008, the disclosures of which are hereby incorporated by reference herein in their entirety.

TECHNICAL FIELD

The present invention relates to a photovoltaic device, and relates particularly to a photovoltaic device in which the electric power generation layer is formed by deposition, and a process for producing such a photovoltaic device.

BACKGROUND ART

One known example of a photovoltaic device used in a solar cell that converts the energy from sunlight into electrical energy is a thin-film silicon-based photovoltaic device comprising a photovoltaic layer formed by using a plasma enhanced CVD method or the like to deposit thin films of a p-type silicon-based semiconductor (p-layer), an i-type silicon-based semiconductor (i-layer) and an n-type silicon-based semiconductor (n-layer).

Advantages of thin-film silicon-based solar cells include the comparative ease with which the surface area can be increased, and the fact that the film thickness is approximately 1/100th that of a crystalline solar cell, meaning minimal material is required. As a result, thin-film silicon-based solar cells can be produced at lower cost than crystalline solar cells. However, a drawback of thin-film silicon-based solar cells is the fact that the conversion efficiency is lower than that of crystalline solar cells. In this technical field, improving the conversion efficiency is a very important task.

For example, in patent citation 1 and patent citation 2, the band gaps of the p-layer and the n-layer are widened by adding nitrogen to the p-layer and n-layer, thereby improving the conversion efficiency by increasing the open-circuit voltage.

Patent Citation 1: Japanese Unexamined Patent Application, Publication No. 2005-277021
Patent Citation 2: Japanese Unexamined Patent Application, Publication No. 2006-120930

DISCLOSURE OF INVENTION

It is known that when an impurity is added to a p-layer or an n-layer, a decrease in the carrier concentration or an increase in the defect density results in a decrease in the conductivity. A lower concentration of the impurity such as nitrogen tends to facilitate crystallization of the p-layer or n-layer. In other words, when the crystallization ratio for the p-layer or the n-layer is low, the conductivity decreases, and when deposited on top of the i-layer, the bonding to the i-layer also worsens, resulting in a deterioration in the photovoltaic conversion efficiency. Accordingly, the patent citation 1 and the patent citation 2 make the assumption that setting the crystallization ratios for the p-layer and n-layer to high values is essential.

In those cases where nitrogen gas is used as the raw material for adding nitrogen as an impurity, because the nitrogen gas is difficult to decompose within a plasma, incorporating a large quantity of nitrogen within the film is difficult. Consequently, in patent citation 1 and patent citation 2, nitrogen is added to the p-layer and n-layer in low concentrations from 0.001 atomic % to 10 atomic %.

In order to raise the crystallization ratio of the p-layer and the n-layer, the hydrogen dilution ratio ($H_2/SiH_4$) must be increased, but as the quantity of the $SiH_4$ that functions as the raw material for the silicon layer decreases, the deposition rates for the p-layer and n-layer also decrease. In a mass production process, a decrease in the deposition rates for the p-layer and n-layer is undesirable as it results in a significant decrease in productivity. How to best improve the conversion efficiency of a solar cell while ensuring rapid deposition of the p-layer and n-layer and thus a high degree of productivity has been an ongoing problem.

Particularly in those cases where nitrogen is added as an impurity to the n-layer, the conductivity tends to be 4 orders of magnitude or more lower than an n-layer containing no nitrogen. As a result, a problem arises in that the contact properties between the n-layer and the transparent electrode layer formed on the side of the back electrode or the intermediate contact layer of a multi-junction solar cell, worsen significantly, causing a deterioration in the fill factor.

The present invention has been developed in light of the above circumstances, and has an object of providing a photovoltaic device that exhibits increased open-circuit voltage, and an improved fill factor due to an improvement in the contact properties between the n-layer and the back-side transparent electrode layer or intermediate contact layer. Another object of the present invention is to provide a process for producing a photovoltaic device having a high open-circuit voltage and a superior fill factor in which the n-layer is deposited at a rapid rate.

In order to achieve the above objects, a photovoltaic device according to the present invention comprises a photovoltaic layer having a p-layer, an i-layer and an n-layer stacked on top of a substrate, wherein the n-layer comprises a nitrogen-containing n-layer and an interface treatment layer formed on the opposite surface of the nitrogen-containing p-layer to the substrate, the nitrogen-containing n-layer comprises nitrogen atoms at an atomic concentration of not less than 1% and not more than 20% and has a crystallization ratio of not less than 0 but less than 3, and the interface treatment layer has a crystallization ratio of not less than 1 and not more than 6.

By forming a silicon-based n-layer that contains nitrogen atoms at an atomic concentration of not less than 1% and not more than 20% (namely, a nitrogen-containing n-layer), the band gap can be broadened and the open-circuit voltage increased even though the crystallization ratio of the nitrogen-containing n-layer is a low value of not less than 0 but less than 3. Moreover, a silicon-based interface treatment layer having a crystallization ratio of not less than 1 and not more than 6 is formed on the opposite surface of the nitrogen-containing n-layer to the substrate. This enables an improvement in the contact properties between the n-layer and the transparent electrode film that contacts the n-layer, resulting in an improved fill factor, as well as suppression of variation in the fill factor. As a result, a photovoltaic device having a high conversion efficiency and stable performance can be obtained. In the present invention, the crystallization ratio is defined as the ratio Ic/Ia, within a Raman spectrum measured using laser light having a wavelength of 532 nm, of the peak intensity Ic for the crystalline silicon phase at 520 $cm^{-1}$ relative to the peak intensity Ia for the amorphous silicon phase at 480 $cm^{-1}$.

In the present invention, the conductivity of the interface treatment layer is preferably not less than 1 S/cm and not more than 100 S/cm.

By ensuring that the conductivity of the interface treatment layer is within the above range, the contact properties between the n-layer and the transparent electrode film that contacts the n-layer can be improved, and the series resistance is reduced. As a result, a photovoltaic device having an improved fill factor is obtained.

In the present invention, the thickness of the interface treatment layer is preferably not less than 1 nm and not more than 3 nm. By forming an interface treatment layer with a thickness that falls within this range, the degree of improvement in the contact properties is further enhanced, and the series resistance is further reduced. Accordingly, the fill factor can be further improved.

In the present invention, the interface treatment layer preferably contacts the back-side transparent electrode layer. The interface treatment layer preferably contacts the intermediate contact layer.

In the present invention, the i-layer mentioned above is preferably a crystalline intrinsic semiconductor.

By making the interface treatment layer contact the back-side transparent electrode layer and the intermediate contact layer that function as transparent electrode films, the conversion efficiency of the photovoltaic device can be improved.

Furthermore, a process for producing a photovoltaic device according to the present invention comprises forming a silicon-based photovoltaic layer by stacking a p-layer, an i-layer and an n-layer on top of a substrate, wherein formation of the n-layer comprises forming a nitrogen-containing n-layer having a nitrogen atomic concentration of not less than 1% and not more than 20% and a crystallization ratio of not less than 0 but less than 3, and forming an interface treatment layer having a crystallization ratio of not less than 1 and not more than 6 on the opposite surface of the nitrogen-containing p-layer to the substrate.

In the process for producing a photovoltaic device according to the present invention, because the crystallization ratio of the silicon-based nitrogen-containing n-layer is low, there is no need to ensure a high hydrogen dilution ratio during deposition. Accordingly, the nitrogen-containing n-layer can be deposited rapidly, and a photovoltaic device having a high open-circuit voltage can be produced. By forming a silicon-based interface treatment layer with the crystallization ratio described above on the opposite surface of the nitrogen-containing n-layer to the substrate, damage to the nitrogen-containing n-layer caused by etching can be reduced. Accordingly, by employing the present invention, a photovoltaic device having a high conversion efficiency and stable performance can be produced rapidly and easily, resulting in an improvement in productivity.

In the present invention, the interface treatment layer is preferably formed with a conductivity that is not less than 1 S/cm and not more than 100 S/cm.

By forming the interface treatment layer with a conductivity that satisfies the above range, the contact properties between the n-layer and the transparent electrode film that contacts the n-layer can be improved, and the series resistance is reduced. As a result, a photovoltaic device having an improved fill factor can be produced.

In the present invention, the interface treatment layer is preferably formed with a film thickness that is not less than 1 nm and not more than 3 nm.

By forming the interface treatment layer with a thickness that satisfies the above range, the degree of improvement in the contact properties can be further enhanced, the deposition time for the interface treatment layer need only be short, and the productivity for the photovoltaic device can be further improved.

In the present invention, the nitrogen-containing layer is preferably formed by a plasma enhanced CVD method at a radio frequency of not less than 30 MHz and not more than 100 MHz.

At the radio frequency (13.56 MHz) typically used in radio frequency plasma enhanced CVD methods, the nitrogen is difficult to decompose, and therefore the nitrogen atomic concentration incorporated within the nitrogen-containing layer is extremely low relative to the quantity of supplied nitrogen. At frequencies of 27.12 MHz or higher, namely two times the typical 13.56 MHz, improvements start to appear in the decomposition rate. However, if the frequency is too high, then the problem of standing waves causes marked non-uniformity within the plasma, making uniform deposition across a large surface area substrate impossible. Accordingly, by using a radio frequency of not less than 30 MHz and not more than 100 MHz, and preferably not less than 40 MHz and not more than 100 MHz, the nitrogen decomposition rate generated by the plasma increases, and the nitrogen atomic concentration incorporated within the nitrogen-containing layer relative to the quantity of supplied nitrogen also increases. As a result, nitrogen atoms can be incorporated within the nitrogen-containing layer at a high atomic concentration, and the open-circuit voltage can be increased. Furthermore, the nitrogen addition efficiency improves, which has the effect of improving the production efficiency.

The production process of the present invention described above preferably comprises forming a back-side transparent electrode layer on the interface treatment layer. Alternatively, the process preferably comprises forming an intermediate contact layer on the interface treatment layer.

In this manner, by forming the interface treatment layer so as to make contact with the back-side transparent electrode layer or the intermediate contact layer that functions as a transparent electrode film, the contact properties between the transparent electrode layer or the intermediate contact layer and the n-layer can be improved, resulting in an improved fill factor. As a result, a photovoltaic device having a high conversion efficiency can be produced.

According to the present invention, by forming a silicon-based nitrogen-containing n-layer that comprises nitrogen atoms at an atomic concentration of not less than 1% and not more than 20%, and has a crystallization ratio of not less than 0 but less than 3, the open-circuit voltage can be improved. Moreover, by forming a silicon-based interface treatment layer having a crystallization ratio of not less than 1 and not more than 6 on the opposite surface of the nitrogen-containing n-layer to the substrate, the contact properties between the n-layer and the transparent electrode film that contacts the n-layer (either the back-side transparent electrode layer or an intermediate contact layer) can be improved, resulting in an improved fill factor, and any variation in the fill factor can also be suppressed. As a result, a photovoltaic device having a high conversion efficiency and stable performance can be obtained.

During production of the above photovoltaic device, because the crystallization ratio of the nitrogen-containing n-layer is low, there is no need to increase the hydrogen dilution ratio during deposition. As a result, the nitrogen-containing n-layer can be deposited rapidly. Furthermore, making the interface treatment layer an n-type semiconductor facilitates adjustment of the deposition parameters for deposition of the n-layer. Accordingly, the present invention enables a photovoltaic device that has a high conversion efficiency as a result of an improved open-circuit voltage and fill factor, suppressed variation in the fill factor and stable properties to be produced easily and rapidly.

BRIEF DESCRIPTION OF DRAWINGS

FIG. 4 A schematic illustration describing one embodiment for producing a solar cell panel, representing a photovoltaic device according to the first embodiment of the present invention.

| Explanation of Reference: | |
|---|---|
| 1: | Substrate |
| 2: | Substrate-side transparent electrode layer |
| 3: | Photovoltaic layer |
| 4: | Back electrode layer |
| 5, 5a, 5b: | Intermediate contact layer |
| 6: | Solar cell module |
| 7: | Back-side transparent electrode layer |
| 31, 41, 61: | p-layer |
| 32, 42, 62: | i-layer |
| 33, 45, 65: | n-layer |
| 43, 63: | Nitrogen-containing n-layer |
| 44, 64: | Interface treatment layer |
| 91: | First cell layer |
| 92: | Second cell layer |
| 93: | Third cell layer |
| 100: | Photovoltaic device |

BEST MODE FOR CARRYING OUT THE INVENTION

First Embodiment

A description of the structure of a photovoltaic device according to a first embodiment of the present invention is presented below.

Figure 1:
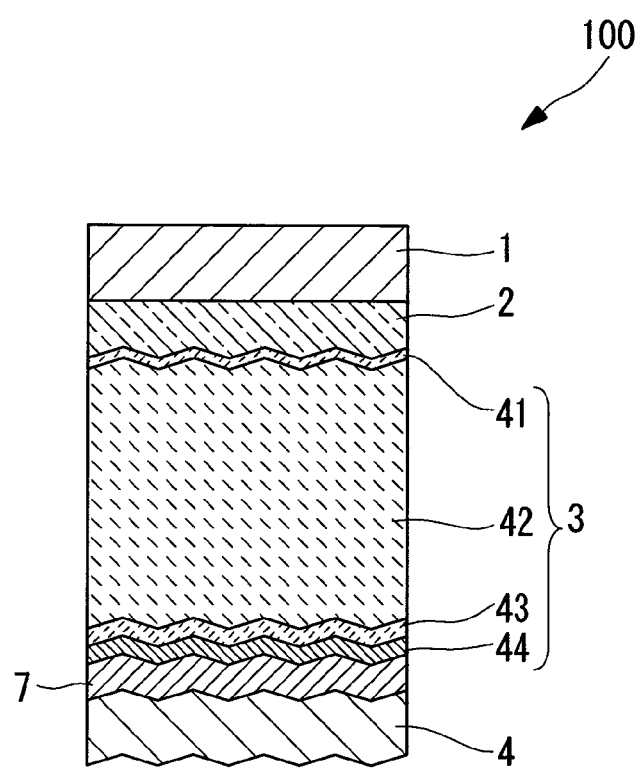
FIG. 1 A cross-sectional view schematically illustrating the structure of a photovoltaic device according to a first embodiment of the present invention.

FIG. 1 is a schematic illustration of the structure of a photovoltaic device according to this embodiment. A photovoltaic device 100 is a silicon-based solar cell, and comprises a substrate 1, a substrate-side transparent electrode layer 2, a photovoltaic layer 3, a back-side transparent electrode layer 7, and a back electrode layer 4. The photovoltaic layer 3 comprises a p-layer 41, an i-layer 42, and a nitrogen-containing n-layer 43 and interface treatment layer 44 as an n-layer. Here, the term "silicon-based" is a generic term that includes silicon (Si), silicon carbide (SiC) and silicon germanium (SiGe). Further, the term "crystalline silicon-based" describes a silicon system other than an amorphous silicon system, and includes both microcrystalline silicon systems and polycrystalline silicon systems.

A description of a process for producing a photovoltaic device according to the first embodiment is presented below with reference to FIG. 2 to FIG. 5, using a solar cell panel as an example.

Figure 2:
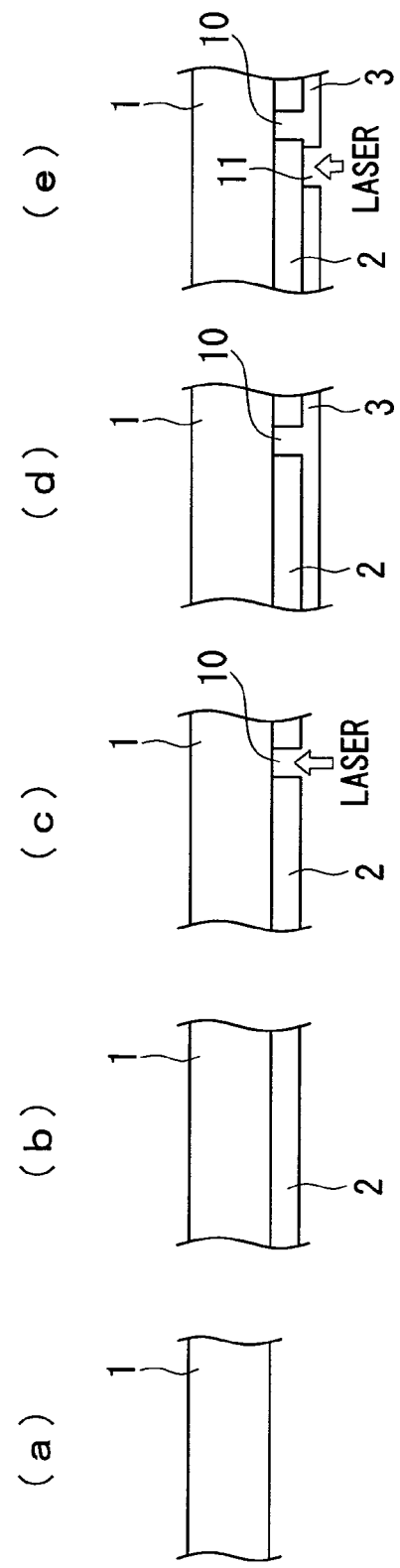
FIG. 2 A schematic illustration describing one embodiment for producing a solar cell panel, representing a photovoltaic device according to the first embodiment of the present invention.

(1) FIG. 2(*a*)

A soda float glass substrate (for example with dimensions of 1.4 m×1.1 m×thickness: 3.5 to 4.5 mm) is used as the substrate 1. The edges of the substrate are preferably subjected to corner chamfering or R-face chamfering to prevent damage caused by thermal stress or impacts or the like.

(2) FIG. 2(*b*)

A transparent electrode film comprising mainly tin oxide ($SnO_2$) and having a film thickness of approximately not less than 500 nm and not more than 800 nm is deposited as the substrate-side transparent electrode layer 2, using a thermal CVD apparatus at a temperature of approximately 500° C. During this deposition, a texture comprising suitable asperity is formed on the surface of the transparent electrode film. In addition to the transparent electrode film, the substrate-side transparent electrode layer 2 may also include an alkali barrier film (not shown in the figure) formed between the substrate 1 and the transparent electrode film. The alkali barrier film is formed using a thermal CVD apparatus at a temperature of approximately 500° C. to deposit a silicon oxide film ($SiO_2$) having a film thickness of 50 nm to 150 nm.

(3) FIG. 2(*c*)

Subsequently, the substrate 1 is mounted on an X-Y table, and the first harmonic of a YAG laser (1064 nm) is irradiated onto the surface of the transparent electrode film, as shown by the arrow in the figure. The laser power is adjusted to ensure an appropriate process speed, and the transparent electrode film is then moved in a direction perpendicular to the direction of the series connection of the electric power generation cells, thereby causing a relative movement between the substrate 1 and the laser light, and conducting laser etching across a strip having a predetermined width of approximately 6 mm to 15 mm to form a slot 10.

(4) FIG. 2(*d*)

Using a plasma enhanced CVD apparatus, the p-layer 41, the i-layer 42, the nitrogen-containing n-layer 43, and the interface treatment layer 44 are stacked sequentially, in that order, on the sunlight-incident side of the substrate-side transparent electrode layer 2, thus forming the photovoltaic layer 3.

In the p-layer deposition chamber, the crystalline silicon p-layer 41 is deposited by introducing $SiH_4$ gas, $H_2$ gas and $B_2H_6$ gas into the chamber, and performing the deposition under conditions including a reduced pressure atmosphere of not more than 3,000 Pa, a substrate temperature of approximately 200° C., and a plasma generation frequency of not less than 40 MHz and not more than 100 MHz. The crystalline silicon p-layer 41 comprises mainly B-doped microcrystalline silicon and has a film thickness of not less than 10 nm and not more than 50 nm.

Next, $SiH_4$ gas and $H_2$ gas are introduced into the i-layer deposition chamber, and the crystalline silicon i-layer 42 is deposited under conditions including a reduced pressure of not more than 3,000 Pa, a substrate temperature of approximately 200° C., and a plasma generation frequency of not less than 40 MHz and not more than 100 MHz. The crystalline silicon i-layer 42 comprises mainly microcrystalline silicon and has a film thickness of not less than 1.2 μm and not more than 3.0 μm.

During formation of the i-layer film comprising mainly microcrystalline silicon using a plasma enhanced CVD method, a distance d between the plasma discharge electrode and the surface of the substrate 1 is preferably not less than 3 mm and not more than 10 mm. If this distance d is less than 3 mm, then the precision of the various structural components within the film deposition chamber required for processing large substrates means that maintaining the distance d at a constant value becomes difficult, which increases the possibility of the electrode getting too close and making the discharge unstable. If the distance d exceeds 10 mm, then achieving a satisfactory deposition rate (of at least 1 nm/s) becomes difficult, and the uniformity of the plasma also deteriorates, causing a deterioration in the quality of the film due to ion impact.

The nitrogen-containing n-layer 43 is then deposited. $SiH_4$ gas, $H_2$ gas, $PH_3$ gas and $N_2$ gas are introduced into the p-layer deposition chamber. At this point, in consideration of the deposition rate, the hydrogen dilution ratio $H_2/SiH_4$ is preferably set to approximately 100-fold. The $N_2$ gas is introduced at a flow rate that yields a $N_2$ gas concentration $N_2/(N_2+SiH_4)$ of not less than 14% and not more than 63%. The nitrogen-containing n-layer 43 is deposited under conditions including a reduced pressure of not more than 3,000 Pa, a substrate temperature of approximately 200° C., and a plasma generation frequency of not less than 30 MHz and not more than 100 MHz (and preferably not less than 40 MHz and not more than 100 MHz). By conducting the deposition under these conditions, a nitrogen-containing layer is formed that has a nitrogen atomic concentration of not less than 1% and not more than 20%, and preferably not less than 8% and not more than 18%, as well as a crystallization ratio of not less than 0 but less than 3. In the present embodiment, the film thickness of the nitrogen-containing n-layer 43 is not less than 10 nm and not more than 50 nm.

Next, the interface treatment layer 44 is deposited. Deposition of the interface treatment layer 44 may be performed either in the same deposition chamber as that used for the nitrogen-containing n-layer 43, or in a separate deposition chamber. Performing the deposition of the interface treatment layer 44 in the same chamber as the nitrogen-containing n-layer 43 is advantageous as adjustment of the deposition parameters is relatively simple, and the production time can be reduced dramatically.

For example, $SiH_4$ gas, $H_2$ gas and $PH_3$ gas are introduced into the n-layer deposition chamber. The interface treatment layer 44 is then deposited under conditions including a reduced pressure atmosphere of not more than 3,000 Pa, a substrate temperature of approximately 200° C., and a plasma generation frequency of not less than 40 MHz and not more than 100 MHz, with the hydrogen dilution ratio adjusted to achieve a crystallization ratio for the interface treatment layer of not less than 1 and mot more than 6, and preferably not less than 2.5 and not more than 5.5.

If deposition of an n-type semiconductor film is conducted under low hydrogen dilution ratio conditions, then a film comprising a mixture of amorphous and crystalline phases is obtained, meaning the crystallization ratio is low. In such cases, because a film comprising a large number of defects such as dangling bonds and hydrogen-terminated bonds is generated, the crystallization ratio is low. In contrast, if deposition of an n-type semiconductor film is conducted under high hydrogen dilution ratio conditions, then the crystallization ratio increases, the number of the above-mentioned defects decreases, and the conductivity improves. However, the more the crystallization ratio increases, the larger the nucleation density becomes, and the smaller the particle size becomes. Because the number of grain boundaries increases as the particle size decreases, the conductivity also tends to decrease. Moreover, when the deposition time is still short (during initial deposition), if the hydrogen dilution ratio is high then an etching effect tends to be more prominent than the film-forming effect, meaning underlying layers can be damaged.

Figure 6:
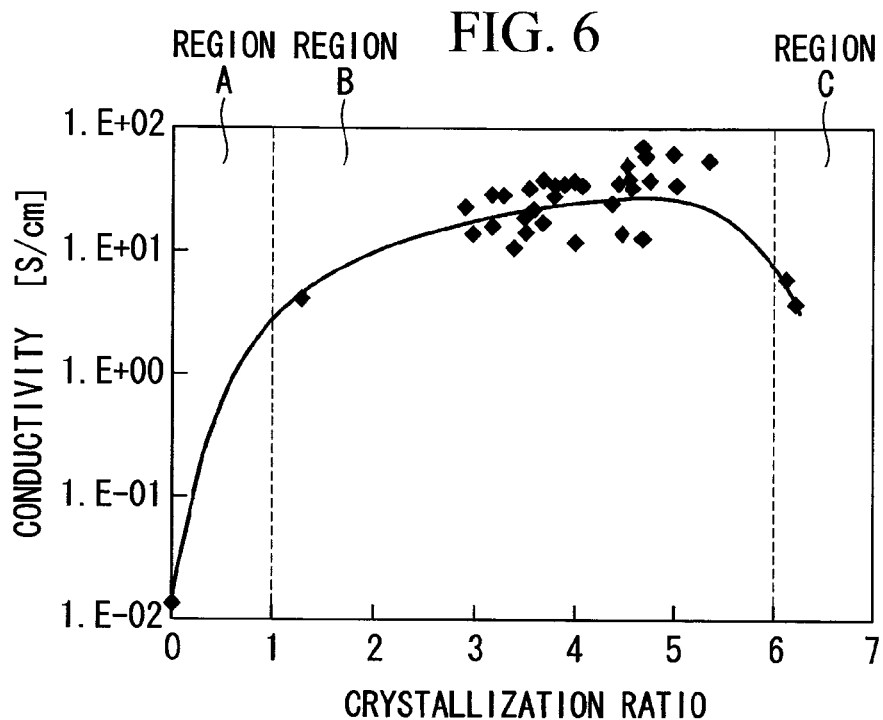
FIG. 6 A graph illustrating the relationship between the crystallization ratio and the conductivity of a silicon-based n-type semiconductor film.

FIG. 6 illustrates the results of evaluating the conductivity and the crystallization ratio when a silicon-based n-type semiconductor film of film thickness 100 nm is deposited on a glass substrate. In FIG. 6, the horizontal axis represents the crystallization ratio of the silicon-based n-type semiconductor film, and the vertical axis represents the conductivity. The crystallization ratio was determined from the peak intensity of a Raman spectrum obtained when a laser light was irradiated onto the silicon-based n-type semiconductor film.

As illustrated in FIG. 6, when the crystallization ratio of the silicon-based n-type semiconductor film was not less than 1 and not more than 6 (region B), a conductivity of not less than 1 S/cm and not more than 100 S/cm was obtained. The conductivity exhibited a particularly high value of not less than 10 S/cm and not more than 100 S/Cm when the crystallization ratio of the silicon-based n-type semiconductor film was within a range from not less than 2.5 to not more than 5.5. If the crystallization ratio exceeded 6 (region C), then the conductivity tended to deteriorate.

In this manner, ideal ranges exist for the crystallization ratio and the conductivity of the interface treatment layer. In other words, by forming the interface treatment layer from an n-type semiconductor film having a crystallization ratio of not less than 1 and not more than 6, and preferably not less than 2.5 and not more than 5.5, the contact properties between the n-layer and the back-side transparent electrode can be improved, and damage of the nitrogen-containing n-layer can be reduced.

In the present embodiment, the thickness of the interface treatment layer is not less than 1 nm and not more than 3 nm. Provided the thickness of the interface treatment layer falls within this range, a high degree of conductivity is obtained, and the series resistance decreases. In other words, the contact properties between the n-layer and the substrate-side transparent electrode layer are further enhanced, and the fill factor is also further improved.

(5) FIG. 2(*e*)

The substrate 1 is mounted on an X-Y table, and the second harmonic of a laser diode excited YAG laser (532 nm) is irradiated onto the film surface of the photovoltaic layer 3, as shown by the arrow in the figure. With the pulse oscillation set to 10 kHz to 20 kHz, the laser power is adjusted so as to achieve a suitable process speed, and laser etching is conducted at a point approximately 100 µm to 150 µm to the side of the laser etching line within the transparent electrode layer 2, so as to form a slot 11. The laser may also be irradiated from the side of the substrate 1, and in this case, because the high vapor pressure generated by the energy absorbed by the photovoltaic layer 3 can be utilized in etching the photovoltaic layer 3, more stable laser etching processing can be performed. The position of the laser etching line is determined with due consideration of positioning tolerances, so as not to overlap with the previously formed etching line.

Figure 3:
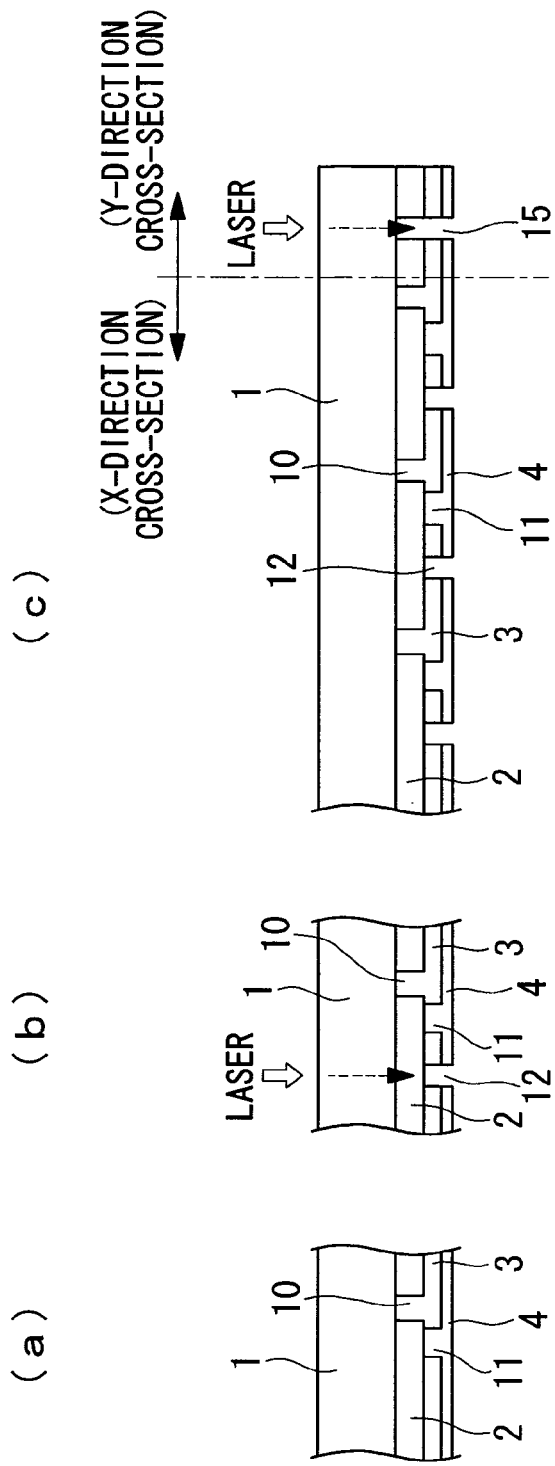
FIG. 3 A schematic illustration describing one embodiment for producing a solar cell panel, representing a photovoltaic device according to the first embodiment of the present invention.

(6) FIG. 3(*a*)

In order to reduce the contact resistance between the p-layer and the back electrode layer 4 and improve the light reflectance, a back-side transparent electrode film composed of a GZO (Ga-doped ZnO) film with a film thickness of not less than 50 nm and not more than 100 nm is formed between the photovoltaic layer 3 and the back electrode layer 4 using a sputtering apparatus.

Subsequently, using a sputtering apparatus, an Ag film and a Ti film are deposited sequentially as the back electrode layer 4 under a reduced pressure atmosphere and at a deposition temperature of approximately 150° C. to 200° C. In this embodiment, an Ag film having a thickness of not less than 150 nm and not more than 500 nm, and a highly corrosion-resistant Ti film having a thickness of not less than 10 nm and not more than 20 nm which acts as a protective film for the Ag film are stacked in that order. Alternatively, the back electrode layer 4 may be formed as a stacked structure composed of a Ag film having a thickness of 25 nm to 100 nm, and an Al film having a thickness of 15 nm to 500 nm.

(7) FIG. 3(*b*)

The substrate 1 is mounted on an X-Y table, and the second harmonic of a laser diode excited YAG laser (532 nm) is irradiated through the substrate 1, as shown by the arrow in the figure. The laser light is absorbed by the photovoltaic layer 3, and by utilizing the high gas vapor pressure generated at this point, the back-side transparent electrode layer 7 and the back electrode layer 4 are removed by explosive fracture. With the pulse oscillation set to not less than 1 kHz and not more than 10 kHz, the laser power is adjusted so as to achieve a suitable process speed, and laser etching is conducted at a point approximately 250 µm to 400 µm to the side of the laser etching line within the transparent electrode layer 2, so as to form a slot 12.

(8) FIG. 3(*c*) and FIG. 4(*a*)

The electric power generation region is then compartmentalized, by using laser etching to remove the effect wherein the serially connected portions at the film edges near the edges of the substrate are prone to short circuits. The substrate 1 is mounted on an X-Y table, and the second harmonic of a laser diode excited YAG laser (532 nm) is irradiated through the substrate 1. The laser light is absorbed by the transparent electrode layer 2 and the photovoltaic layer 3, and by utilizing the high gas vapor pressure generated at this point, the back electrode layer 4 is removed by explosive fracture, and the back electrode layer 4, the back-side transparent electrode layer, the photovoltaic layer 3 and the substrate-side transparent electrode layer 2 are removed. With the pulse oscillation set to not less than 1 kHz and not more than 10 kHz, the laser power is adjusted so as to achieve a suitable process speed, and laser etching is conducted at a point approximately 5 mm to 20 mm from the edge of the substrate 1, so as to form an X-direction insulation slot 15 as illustrated in FIG. 3(*c*). FIG. 3(*c*) represents an X-direction cross-sectional view cut along the direction of the series connection of the photovoltaic layer 3, and therefore the location in the figure where the insulation slot 15 is formed should actually appear as a peripheral film removed region 14 in which the back electrode layer 4, the back-side transparent electrode layer, the photovoltaic layer 3 and the transparent electrode layer 2 have been removed by film polishing (see FIG. 4(*a*)), but in order to facilitate description of the processing of the edges of the substrate 1, this location in the figure represents a Y-direction cross-sectional view, so that the formed insulation slot represents an X-direction insulation slot 15. A Y-direction insulation slot need not be provided at this point, because a film surface polishing and removal treatment is conducted on the peripheral film removal regions of the substrate 1 in a later step.

Completing the etching of the insulation slot 15 at a position 5 mm to 15 mm from the edge of the substrate 1 is preferred, as it ensures that the insulation slot 15 is effective in inhibiting external moisture from entering the interior of the solar cell module 6 via the edges of the solar cell panel.

Although the laser light used in the steps until this point has been specified as YAG laser light, light from a YVO4 laser or fiber laser or the like may also be used in a similar manner.
(9) FIG. 4 (*a*: View from Solar Cell Film Surface Side, *b*: View from Substrate Side of Light Incident Surface)

In order to ensure favorable adhesion and sealing of a backing sheet 24 via EVA or the like in a subsequent step, the stacked films around the periphery of the substrate 1 (in a peripheral film removal region 14), which tend to be uneven and prone to peeling, are removed to form a peripheral film removed region 14. During removal of the films from a region that is 5 mm to 20 mm from the edge around the entire periphery of the substrate 1, grinding or blast polishing or the like is used to remove the back electrode layer 4, the back-side transparent electrode layer, the photovoltaic layer 3 and the transparent electrode layer 2 from a region that is closer to the substrate edge in the X direction than the insulation slot 15 provided in the above step of FIG. 3(*c*), and closer to the substrate edge in the Y direction than the slot 10 provided near the substrate edge.

Grinding debris or abrasive grains are removed by washing the substrate 1.
(10) FIG. 5(*a*) (*b*)

An attachment portion for a terminal box 23 is prepared by providing an open through-window in the backing sheet 24 to expose a collecting plate. A plurality of layers of an insulating material are provided in this open through-window portion in order to prevent external moisture and the like entering the solar cell module.

Processing is conducted so as to enable current collection, using a copper foil, from the series-connected solar cell electric power generation cell at one end, and the solar cell electric power generation cell at the other end, in order to enable electric power to be extracted from the terminal box 23 on the rear surface of the solar cell panel. In order to prevent short circuits between the copper foil and the various portions, an insulating sheet that is wider than the width of the copper foil is provided.

Following arrangement of the collecting copper foil and the like at predetermined positions, the entire solar cell module 6 is covered with a sheet of an adhesive filling material such as EVA (ethylene-vinyl acetate copolymer), which is arranged so as not to protrude beyond the substrate 1.

A backing sheet 24 with a superior waterproofing effect is then positioned on top of the EVA. In this embodiment, in order to achieve a superior waterproofing and moisture-proofing effect, the backing sheet 24 is formed as a three-layer structure comprising a PET sheet, an Al foil and a PET sheet.

The structure comprising the components up to and including the backing sheet 24 arranged in predetermined positions is subjected to internal degassing under a reduced pressure atmosphere and under pressing at approximately 150° C. to 160° C. using a laminator, thereby causing cross-linking of the EVA that tightly seals the structure.
(11) FIG. 5(*a*)

The terminal box 23 is attached to the back of the solar cell module 6 using an adhesive.
(12) FIG. 5(*b*)

The copper foil and an output cable from the terminal box 23 are connected using solder or the like, and the interior of the terminal box 23 is filled and sealed with a sealant (a potting material). This completes the production of the solar cell panel 50.
(13) FIG. 5(*c*)

Figure 5:
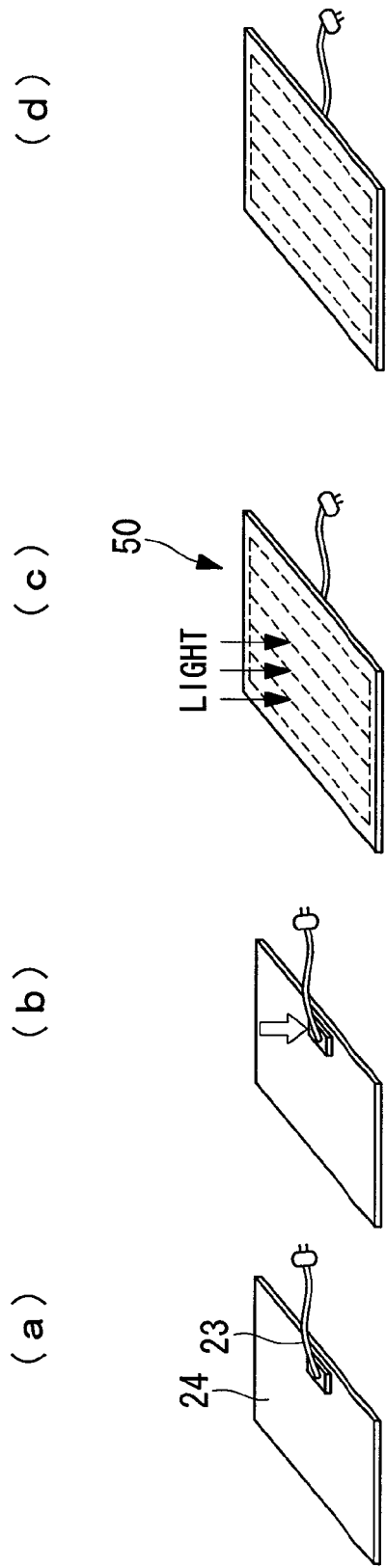
FIG. 5 A schematic illustration describing one embodiment for producing a solar cell panel, representing a photovoltaic device according to the first embodiment of the present invention.

The solar cell panel 50 formed via the steps up to and including FIG. 5(*b*) is then subjected to an electric power generation test, as well as other tests for evaluating specific performance factors. The electric power generation test is conducted using a solar simulator that emits a standard sunlight of AM 1.5 (1,000 W/m$^2$).
(14) FIG. 5(*d*)

In tandem with the electric power generation test (FIG. 5(*c*)), a variety of specific performance factors including the external appearance are evaluated.

Figure 7:
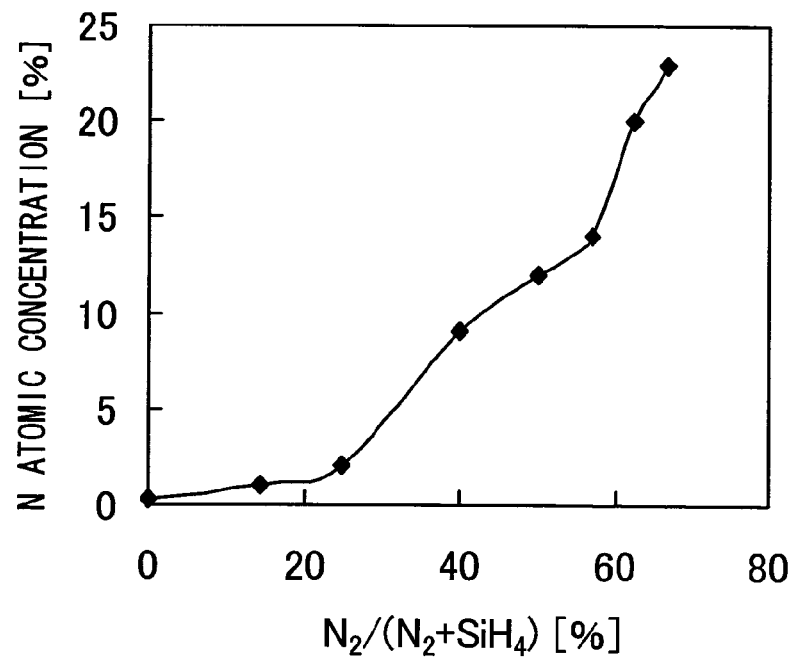
FIG. 7 A graph illustrating the relationship between the $N_2$ gas concentration and the nitrogen atomic concentration within the nitrogen-containing n-layer in the first embodiment.

FIG. 7 is a graph illustrating the relationship between the N$_2$ gas concentration and the nitrogen atomic concentration within the nitrogen-containing n-layer. In this figure, the horizontal axis represents the N$_2$ gas concentration, and the vertical axis represents the nitrogen atomic concentration. The deposition conditions for the nitrogen-containing n-layer included a hydrogen dilution ratio of 100-fold, a deposition pressure of 93 Pa, a deposition temperature of 170° C., a radio frequency of 60 MHz, an applied electric power of 15 W, and a film thickness of 30 nm.

The nitrogen atomic concentration within the film increased as the proportion of N$_2$ gas was increased. When the N$_2$ gas concentration was not less than 14% and not more than 63%, the nitrogen atomic concentration was not less than 1% and not more than 20%, indicating the incorporation of a large quantity of nitrogen atoms within the n-layer.

Figure 8:
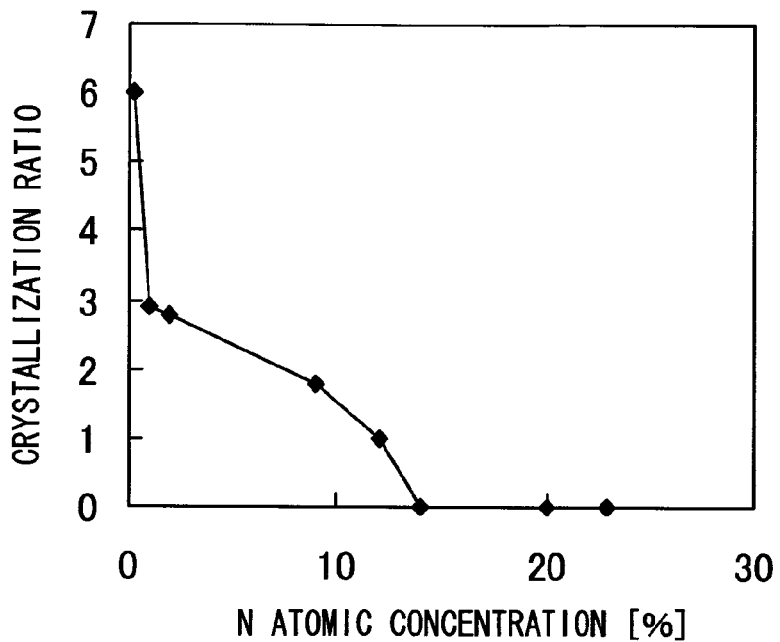
FIG. 8 A graph illustrating the relationship between the nitrogen atomic concentration within the nitrogen-containing n-layer and the crystallization ratio of the nitrogen-containing n-layer in the first embodiment.

FIG. 8 is a graph illustrating the relationship between the nitrogen atomic concentration within the nitrogen-containing n-layer and the crystallization ratio of the nitrogen-containing n-layer. In this figure, the horizontal axis represents the nitrogen atomic concentration, and the vertical axis represents the crystallization ratio.

When no nitrogen was added to the n-layer, a high crystallization ratio was achieved, but when the nitrogen atomic concentration was 1% or greater, the crystallization ratio was less than 3. When the nitrogen atomic concentration was 14% or greater, the crystallization ratio was 0, indicating an amorphous film.

Figure 9:
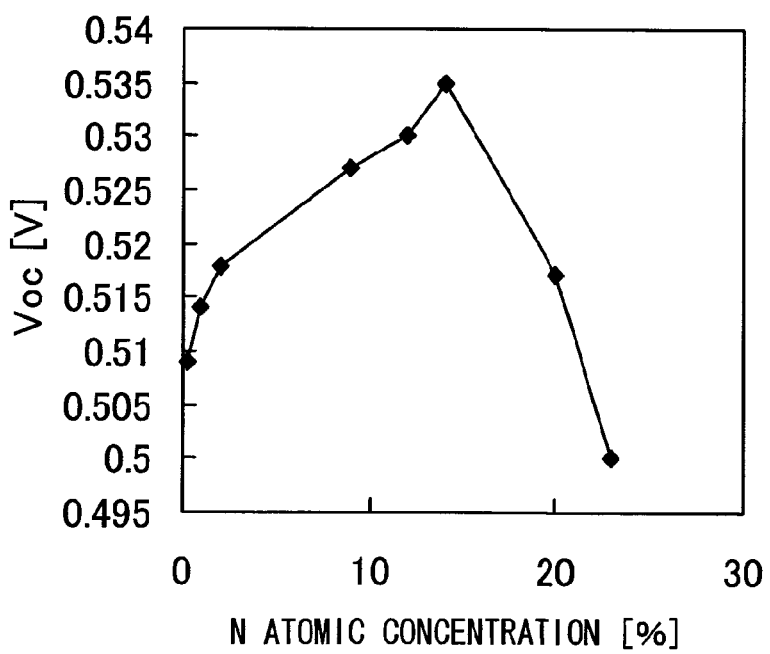
FIG. 9 A graph illustrating the relationship between the nitrogen atomic concentration within the nitrogen-containing n-layer and the open-circuit voltage of the solar cell module in the first embodiment.

FIG. 9 is a graph illustrating the relationship between the nitrogen atomic concentration within the nitrogen-containing n-layer and the open-circuit voltage of the solar cell module. In this figure, the horizontal axis represents the nitrogen atomic concentration, and the vertical axis represents the open-circuit voltage. The deposition conditions for the p-layer included a hydrogen dilution ratio of 100-fold, a deposition pressure of 67 Pa, a deposition temperature of 200° C., a radio frequency of 100 MHz, an applied electric power of 75 W, and a film thickness of 30 nm, whereas the deposition conditions for the i-layer included a hydrogen dilution ratio of 21.4-fold, a deposition pressure of 400 Pa, a deposition temperature of 200° C., a radio frequency of 100 MHz, an applied electric power of 30 W, and a film thickness of 2 μm.

The open-circuit voltage for a solar cell module in which the nitrogen atomic concentration within the n-layer was not less than 1% and not more than 20% was higher than that for a solar cell module in which no nitrogen was added. In particular, when the nitrogen atomic concentration was not less than 8% and not more than 18%, the open-circuit voltage was not less than 0.525 V, which represents an increase of at least 0.15 V from the case in which no nitrogen was added. In contrast, a nitrogen atomic concentration exceeding 20% actually resulted in a decrease in the open-circuit voltage.

The rate of deposition for the nitrogen-containing p-layer tended to decrease as the crystallization ratio increased. The deposition rate when the crystallization ratio of the nitrogen-containing n-layer was less than 3 was not less than 60% of the deposition rate when the crystallization ratio of the nitrogen-containing n-layer was 0 (namely, amorphous silicon). This indicates that provided the crystallization ratio of the nitrogen-containing n-layer is less than 3, an n-layer comprising added nitrogen can be deposited without any significant adverse effects in terms of reduced productivity.

Table 1 shows the properties of solar cells comprising an interface treatment layer formed with a crystallization ratio and conductivity corresponding with a region A, region B or region C shown in FIG. 6. For each solar cell, the deposition conditions for the p-layer (B-doped crystalline silicon) included a hydrogen dilution ratio of 100-fold, a deposition pressure of 67 Pa, a deposition temperature of 165° C., a radio frequency of 100 MHz, an applied electric power of 75 W, and a film thickness of 30 nm. The deposition conditions for the i-layer (crystalline silicon) for each solar cell included a hydrogen dilution ratio of 21.4-fold, a deposition pressure of 400 Pa, a deposition temperature of 100° C., a radio frequency of 100 MHz, an applied electric power of 30 W, and a film thickness of 2 μm. The deposition conditions for the nitrogen-containing n-layer and the interface treatment layer for each solar cell included a hydrogen dilution ratio of 100-fold, a deposition pressure of 93 Pa, a deposition temperature of 170° C., a radio frequency of 60 MHz, and an applied electric power of 15 W. The film thickness of the nitrogen-containing n-layer was 30 nm, and the film thickness of the interface treatment layer was 2 nm. Each interface treatment layer was deposited under the deposition conditions that yielded the crystallization ratio and conductivity shown in Table 1 when the film thickness was 100 nm, with the deposition time adjusted so as to obtain the desired interface treatment layer thickness.

TABLE 1

| | Nitrogen-containing n-layer Nitrogen concentration (%) | Interface treatment layer | |
|---|---|---|---|
| | | Crystallization ratio | Conductivity (S/cm) |
| Region A | 12 | 0 | 0.013 |
| Region B | 12 | 4.7 | 56 |
| Region C | 12 | 6.3 | 3.8 |
| No interface treatment layer | 12 | — | — |

| | Cell properties | | | | |
|---|---|---|---|---|---|
| | Short-circuit current (mA/cm$^2$) | Open-circuit voltage (V) | Fill factor | Conversion efficiency (%) | Rs (Ω) |
| Region A | 23.87 | 0.522 | 0.653 | 8.13 | 7.5 |
| Region B | 22.78 | 0.525 | 0.699 | 8.36 | 6.8 |
| Region C | 22.53 | 0.515 | 0.679 | 7.88 | 7.1 |
| No interface treatment layer | 22.49 | 0.518 | 0.693 | 8.07 | 7.4 |

When a crystalline silicon interface treatment layer having a crystallization ratio of not less than 1 and not more than 6 was formed (region B), the conductivity increased, and the series resistance Rs decreased and the fill factor increased more than in the other solar cells. As a result, the conversion efficiency increased. In contrast, when an amorphous silicon interface treatment layer (region A) or a crystalline silicon interface treatment layer having a crystallization ratio exceeding 6 (region C) was formed, the conductivity was low, and therefore the series resistance Rs was large and no improvement was observed in the fill factor.

Figure 10:
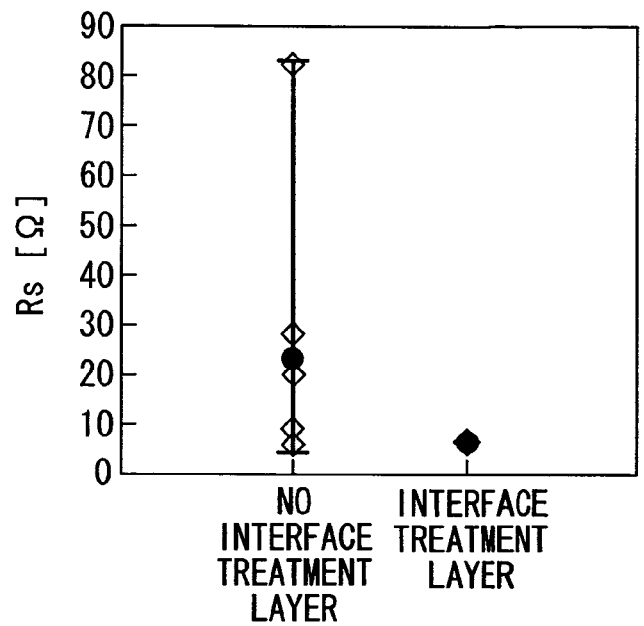
FIG. 10 A graph illustrating the distribution in the series resistance of a solar cell depending on the existence or absence of an interface treatment layer in the first embodiment.
Figure 11:
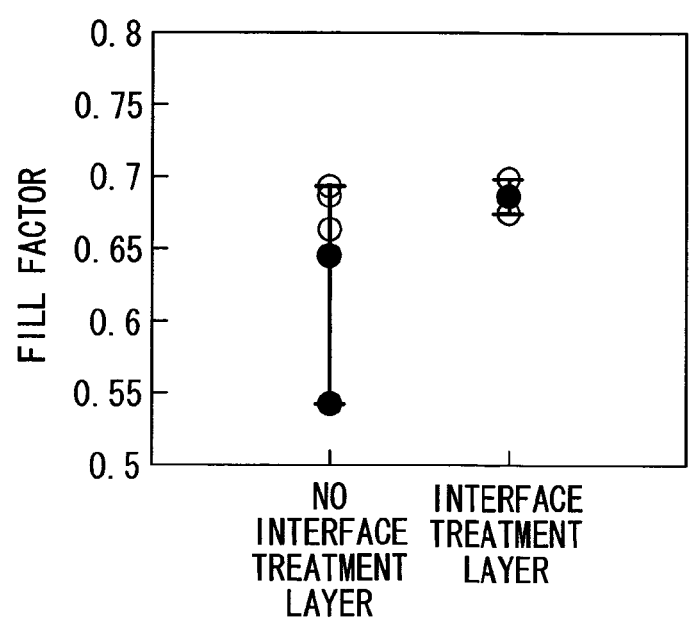
FIG. 11 A graph illustrating the distribution in the fill factor for a solar cell depending on the existence or absence of an interface treatment layer in the first embodiment.

The distributions in the series resistance and the fill factor across a plurality of solar cells comprising an interface treatment layer and a plurality of solar cells having no interface treatment layer are illustrated in FIG. 10 for the series resistance and FIG. 11 for the fill factor. The conditions for formation of each of the layers were the same as those for the solar cells reported in Table 1.

As is clearly evident from FIG. 10 and FIG. 11, the solar cells having an interface treatment layer had a lower series resistance Rs and minimal variation in the resistance value, meaning the fill factor could be stabilized at a high value. This means that solar cells of high conversion efficiency can be obtained with good stability.

Figure 12:
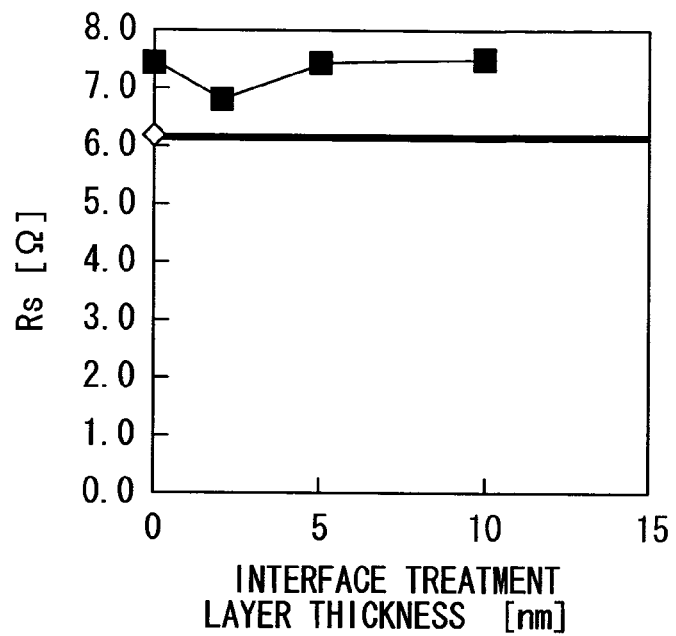
FIG. 12 A graph illustrating the relationship between the interface treatment layer thickness and the series resistance of the solar cell in the first embodiment.
Figure 13:
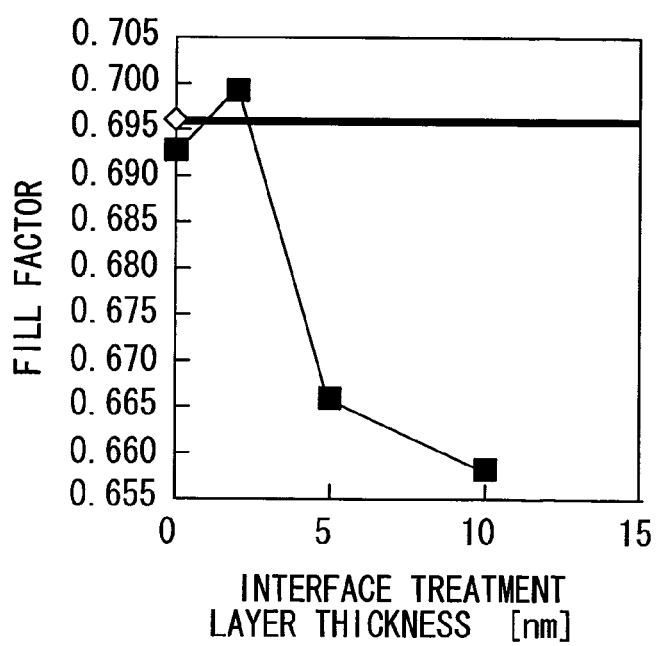
FIG. 13 A graph illustrating the relationship between the interface treatment layer thickness and the fill factor for the solar cell in the first embodiment.
Figure 14:
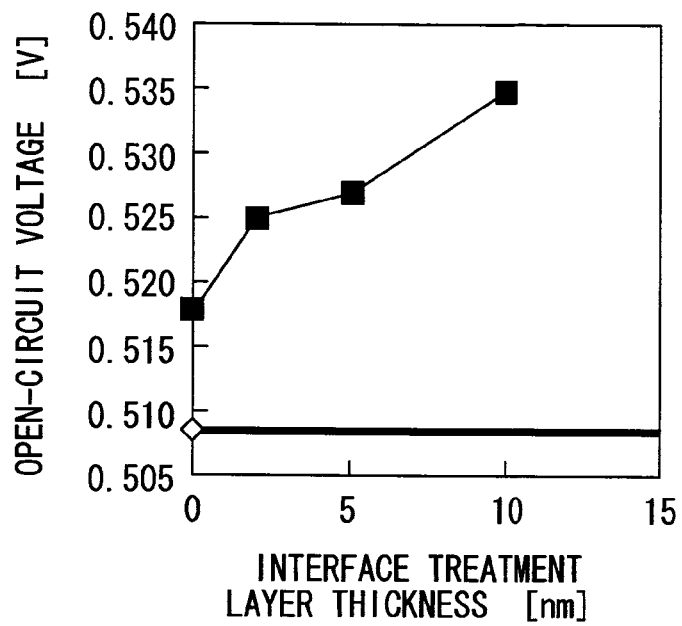
FIG. 14 A graph illustrating the relationship between the interface treatment layer thickness and the open-circuit voltage for the solar cell in the first embodiment.
Figure 15:
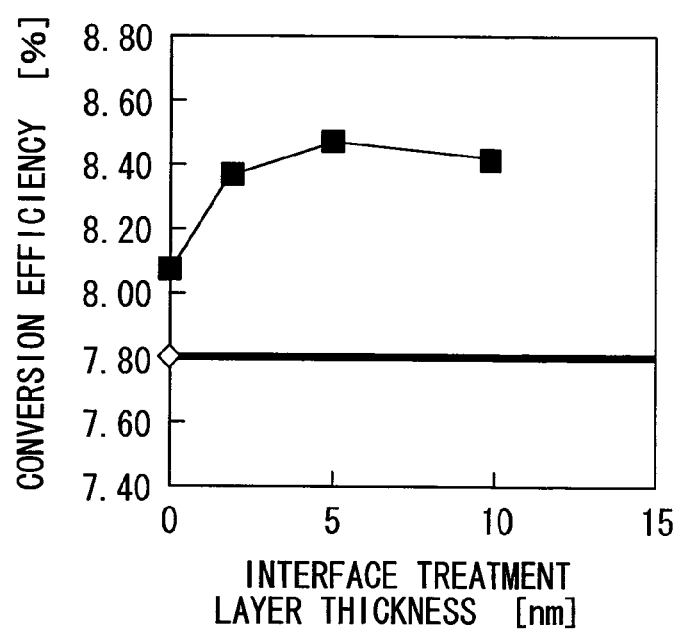
FIG. 15 A graph illustrating the relationship between the interface treatment layer thickness and the photovoltaic conversion efficiency for the solar cell in the first embodiment.

The relationships between the interface treatment layer thickness and the series resistance (FIG. 12), the fill factor (FIG. 13), the open-circuit voltage (FIG. 14) and the conversion efficiency (FIG. 15) of the solar cell are illustrated in the indicated figures. In each figure, the horizontal axis represents the thickness of the interface treatment layer. The vertical axis represents the series resistance in FIG. 12, the fill factor in FIG. 13, the open-circuit voltage in FIG. 14, and the solar cell conversion efficiency in FIG. 15. The conditions for formation of each of the layers, with the exception of the thickness of the interface treatment layer, were the same as those for the solar cells reported in Table 1. In each of the figures, the solid horizontal line represents the value for a conventional solar cell having an n-layer that comprises no nitrogen (and no interface treatment layer).

In the case of an interface treatment layer thickness of 2 nm, the series resistance was lower and the fill factor was higher than those of the other solar cells. From the results in FIG. 12 and FIG. 13 it can be stated that an improvement in the fill factor is obtained when the thickness of the interface treatment layer is not less than 1 nm and not more than 3 nm.

In terms of the open-circuit voltage, formation of the nitrogen-containing n-layer resulted in a dramatic improvement compared with a conventional solar cell. A solar cell in which the interface treatment layer had a thickness of 2 nm exhibited improved photovoltaic conversion efficiency when compared with a conventional solar cell or a solar cell having no interface treatment layer. In the tests that were performed, a high conversion efficiency was obtained even when the thickness of the interface treatment layer was 5 nm or 10 nm, but this is due to the effects of the improved open-circuit voltage evident in FIG. 14 and an increase in the short-circuit current.

Second Embodiment

A description of the structure of a photovoltaic device according to a second embodiment of the present invention is presented below.

Figure 16:
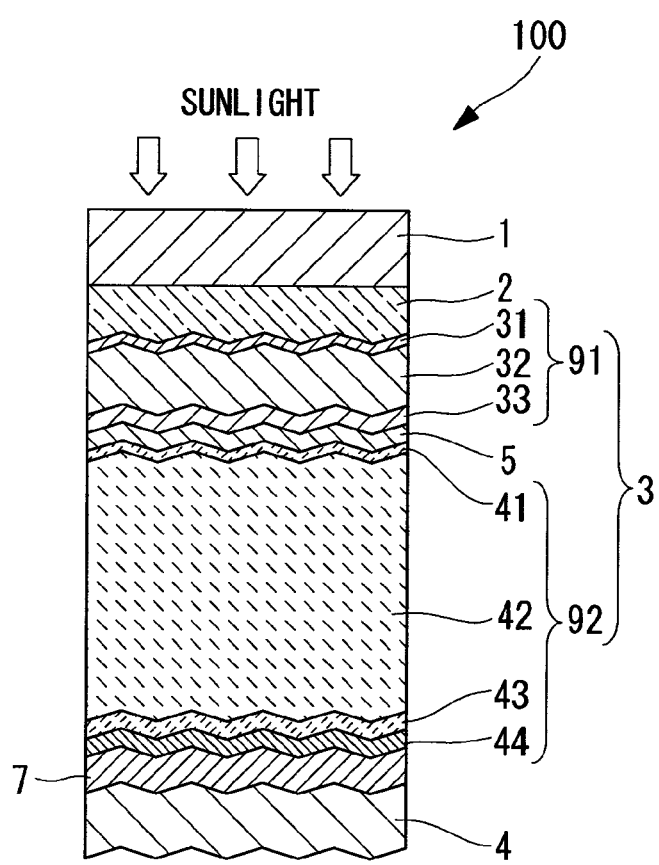
FIG. 16 A cross-sectional view schematically illustrating the structure of a photovoltaic device according to a second embodiment of the present invention.

FIG. 16 is a schematic illustration of the structure of a photovoltaic device according to the second embodiment. This photovoltaic device 100 is a tandem-type silicon-based solar cell. The photovoltaic layer 3 comprises a first cell layer 91 and a second cell layer 92 stacked in that order on the substrate 1. The first cell layer 91 comprises a p-layer 31, an i-layer 32 and an n-layer 33, each composed of a thin film of amorphous silicon, stacked in that order from the sunlight-incident side of the device. The second cell layer 92 comprises a p-layer 41, an i-layer 42, a nitrogen-containing n-layer 43, and an interface treatment layer 44 stacked in that order from the sunlight-incident side of the device. An intermediate contact layer 5 is provided between the first cell layer 91 and the second cell layer 92. A back-side transparent electrode layer 7 and a back electrode layer 4 are stacked in order on the opposite side of the interface treatment layer 44 to the sunlight-incident side.

A description of the steps for forming the photovoltaic layer of a photovoltaic device according to the second embodiment is presented below, using a solar cell panel as an example. The other steps for producing the solar cell panel are substantially the same as those described for the first embodiment, and their description is therefore omitted.

In the case of the first cell layer 91 of the photovoltaic layer 3, $SiH_4$ gas and $H_2$ gas are used as the main raw material gases, and the p-layer 31, the i-layer 32 and the n-layer 33 are deposited in order from the sunlight-incident side of the substrate-side transparent electrode layer 2, under conditions including a reduced pressure atmosphere of not less than 30 Pa and not more than 1,000 Pa, a substrate temperature of approximately 200° C., and a frequency of not less than 40 MHz and not more than 100 MHz. The p-layer 31 is deposited by introducing $B_2H_6$ gas as an additional raw material gas, and is formed as an amorphous B-doped silicon film having a film thickness of not less than 10 nm and not more than 30 nm. The i-layer 32 is an amorphous silicon film, and has a film thickness of not less than 200 nm and not more than 350 nm. The n-layer 33 is deposited by introducing $PH_3$ gas as an additional raw material gas, comprises mainly P-doped silicon in which microcrystalline silicon is incorporated within amorphous silicon, and has a film thickness of not less than 30 nm and not more than 50 nm. In this manner, the n-layer 33 is formed without active inclusion of nitrogen. A buffer layer may be provided between the p-layer 31 and the i-layer 32 to improve the interface properties.

In this embodiment, an intermediate contact layer 5 that functions as a semi-reflective film for improving the contact properties and achieving electrical current consistency is provided between the first cell layer 91 and the second cell layer 92. For example, a GZO (Ga-doped ZnO) film with a film thickness of not less than 20 nm and not more than 100 nm may be deposited as the intermediate contact layer 5 using a sputtering apparatus.

Using the same steps as the first embodiment, the crystalline silicon p-layer 41, the crystalline silicon i-layer 42, the nitrogen-containing n-layer 43, and the interface treatment layer 44 are deposited sequentially on top of the first cell layer 91. In this embodiment, the nitrogen-containing n-layer 43 comprises nitrogen in an atomic concentration of not less than 1% and not more than 20%, and preferably not less than 8% and not more than 18%, and has a crystallization ratio of not less than 0 but less than 3. The film thickness of the nitrogen-containing n-layer 43 is not less than 10 nm and not more than 50 nm. The interface treatment layer 44 has a crystallization ratio of not less than 1 and not more than 6, and preferably not less than 2.5 and not more than 5.5, and has a conductivity of not less than 1 S/cm and not more than 100 S/cm, and preferably not less than 10 S/cm and not more than 100 S/cm. The thickness of the interface treatment layer 44 is not less than 1 nm and not more than 3 nm.

In the second embodiment, the relationship between the $N_2$ gas concentration and the nitrogen atomic concentration within the nitrogen-containing n-layer, the relationship between the nitrogen atomic concentration within the nitrogen-containing n-layer and the crystallization ratio, and the relationship between the nitrogen atomic concentration within the nitrogen-containing n-layer and the open-circuit voltage for the solar cell module exhibited the same tendencies as the first embodiment, as illustrated in FIG. 7 to FIG. 9 respectively.

Figure 17:
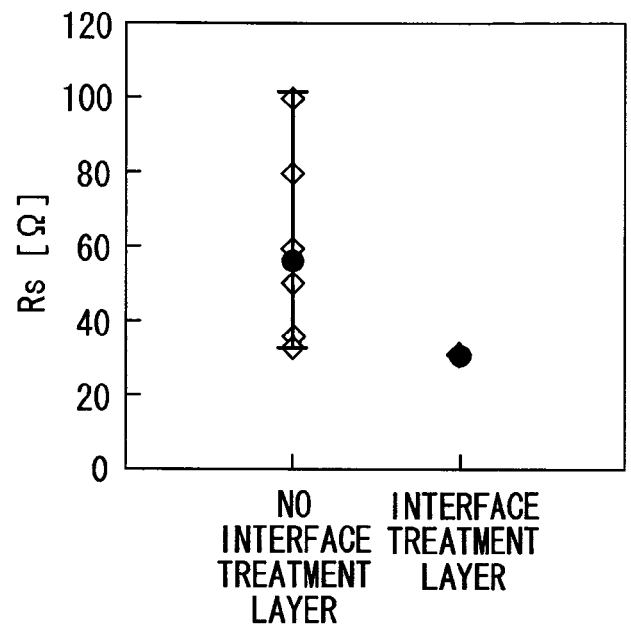
FIG. 17 A graph illustrating the distribution in the series resistance of a solar cell depending on the existence or absence of an interface treatment layer in the second embodiment.
Figure 18:
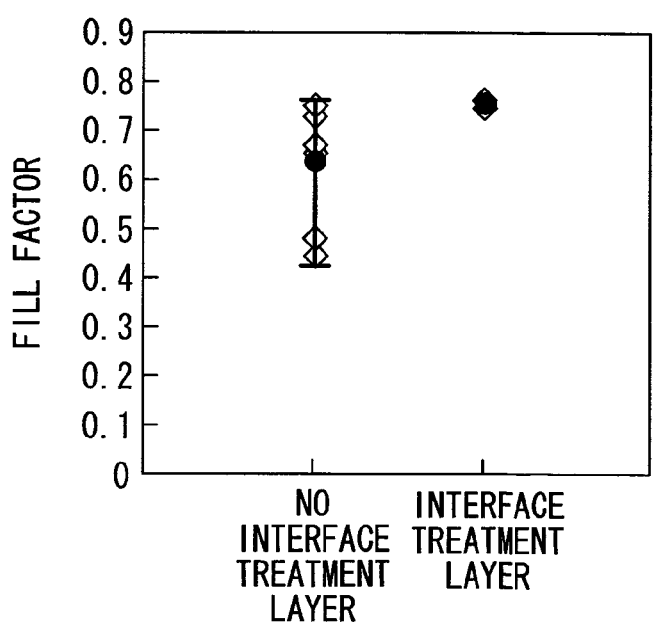
FIG. 18 A graph illustrating the distribution in the fill factor for a solar cell depending on the existence or absence of an interface treatment layer in the second embodiment.

The distributions in the series resistance and the fill factor across a plurality of solar cells comprising an interface treatment layer and a plurality of solar cells having no interface treatment layer are illustrated in FIG. 17 for the series resistance and FIG. 18 for the fill factor. Using the deposition conditions described above, the first cell layer was deposited with a p-layer thickness of 8 nm, an i-layer thickness of 300 nm, and an n-layer thickness of 40 nm. The deposition conditions for the second cell layer were the same as those described for the first embodiment.

In this embodiment also, the solar cells having an interface treatment layer had a lower series resistance Rs and minimal variation in the resistance value, meaning the fill factor could be stabilized at a high value. This means that tandem solar cells of high conversion efficiency can be obtained with good stability.

Figure 19:
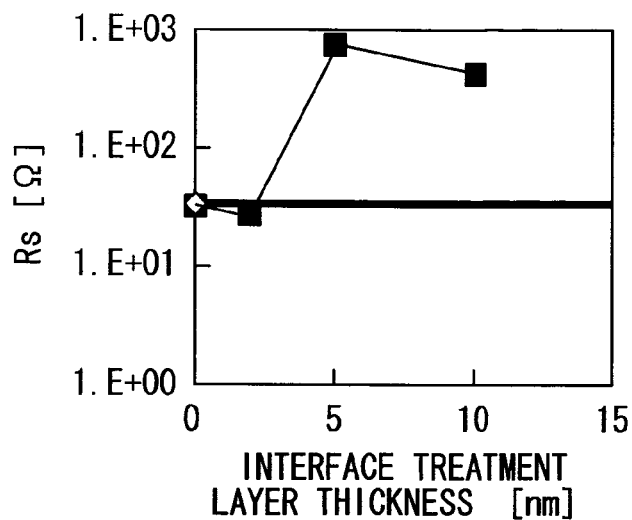
FIG. 19 A graph illustrating the relationship between the interface treatment layer thickness and the series resistance of the solar cell in the second embodiment.
Figure 20:
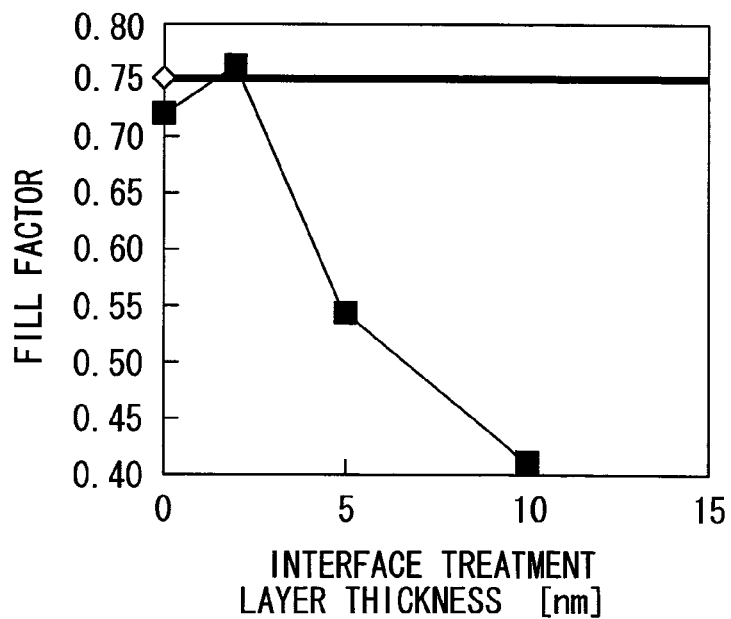
FIG. 20 A graph illustrating the relationship between the interface treatment layer thickness and the fill factor for the solar cell in the second embodiment.
Figure 21:
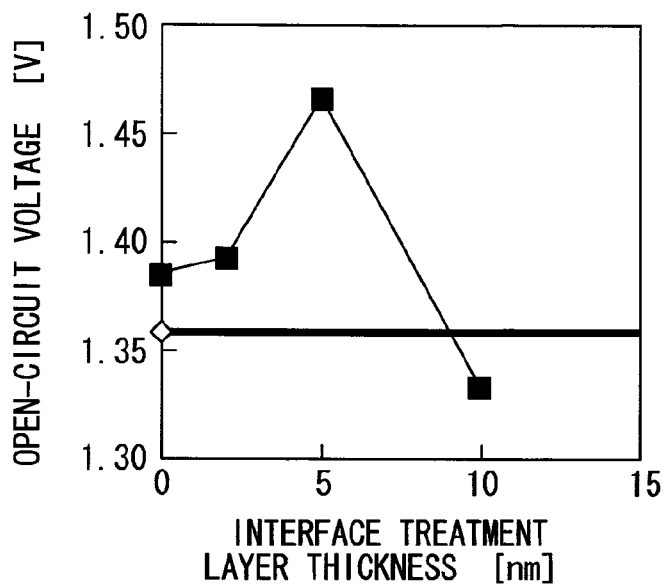
FIG. 21 A graph illustrating the relationship between the interface treatment layer thickness and the open-circuit voltage for the solar cell in the second embodiment.
Figure 22:
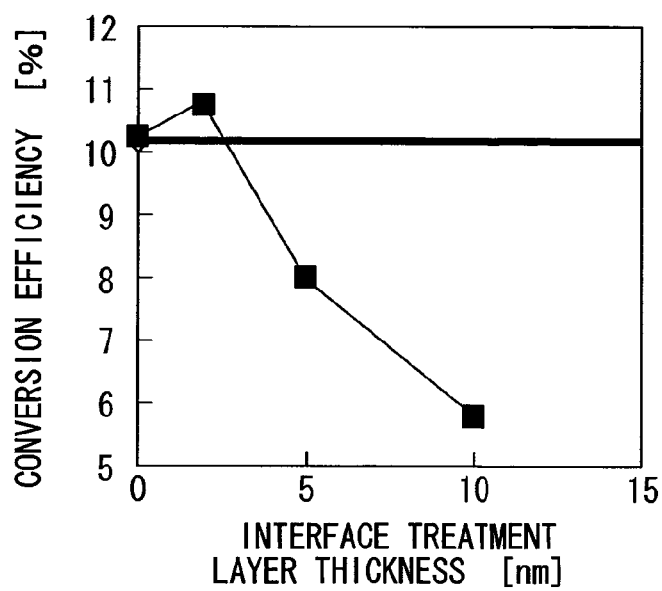
FIG. 22 A graph illustrating the relationship between the interface treatment layer thickness and the photovoltaic conversion efficiency for the solar cell in the second embodiment.

The relationships between the interface treatment layer thickness and the series resistance (FIG. 19), the fill factor (FIG. 20), the open-circuit voltage (FIG. 21) and the conversion efficiency (FIG. 22) of the solar cell are illustrated in the indicated figures. In each figure, the horizontal axis represents the thickness of the interface treatment layer. The vertical axis represents the series resistance in FIG. 19, the fill factor in FIG. 20, the open-circuit voltage in FIG. 21, and the solar cell conversion efficiency in FIG. 22. The conditions for formation of each of the layers, with the exception of the thickness of the interface treatment layer, were the same as those for the solar cells of FIG. 17 and FIG. 18. In each of the figures, the solid horizontal line represents the value for a conventional solar cell having an n-layer that comprises no nitrogen (and no interface treatment layer).

In the case of an interface treatment layer thickness of 2 nm, the series resistance was lower and the fill factor was higher than those of the other solar cells. From the results in FIG. 19 and FIG. 20 it can be stated that an improvement in the fill factor is obtained when the thickness of the interface treatment layer is not less than 1 nm and not more than 3 nm. In terms of the open-circuit voltage, formation of the nitrogen-containing n-layer resulted in a dramatic improvement compared with a conventional solar cell. A solar cell in which the interface treatment layer had a thickness of 2 nm exhibited improved photovoltaic conversion efficiency when compared with a conventional solar cell or a solar cell having no interface treatment layer.

Third Embodiment

A description of the structure of a photovoltaic device according to a third embodiment of the present invention is presented below.

Figure 23:
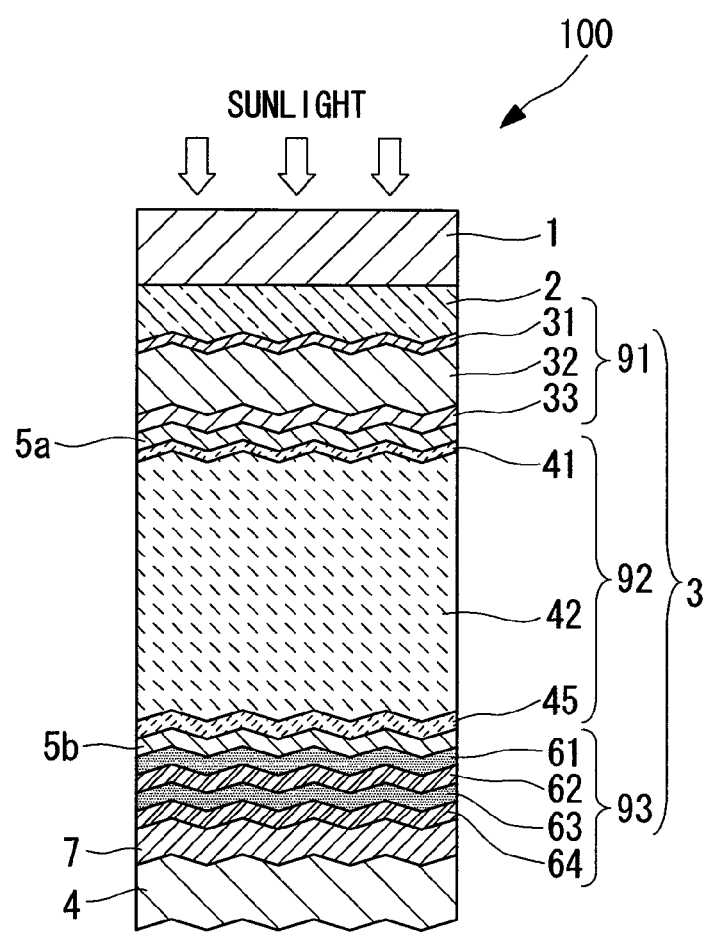
FIG. 23 A cross-sectional view schematically illustrating the structure of a photovoltaic device according to a third embodiment of the present invention.

FIG. 23 is a schematic illustration of the structure of a photovoltaic device according to the third embodiment. This photovoltaic device 100 is a triple silicon-based solar cell. The photovoltaic layer 3 comprises a first cell layer 91, a second cell layer 92 and a third cell layer 93 stacked in that order on the substrate 1. The first cell layer 91 comprises a p-layer 31, an i-layer 32 and an n-layer 33, each composed of a thin film of amorphous silicon, stacked in that order from the sunlight-incident side of the device. The second cell layer 92 comprises a p-layer 41, an i-layer 42 and an n-layer 45 stacked in that order from the sunlight-incident side of the device. The third cell layer 93 comprises a p-layer 61, an i-layer 62, a nitrogen-containing n-layer 63 and an interface treatment layer 64 stacked in that order from the sunlight-incident side of the device. Intermediate contact layers 5a and 5b are provided between the first cell layer 91 and the second cell layer 92, and between the second cell layer 92 and the third cell layer 93 respectively. A back-side transparent electrode layer 7 and a back electrode layer 4 are stacked in order on the opposite side of the interface treatment layer 64 to the sunlight-incident side.

A description of the steps for forming the photovoltaic layer of a photovoltaic device according to the third embodiment is presented below, using a solar cell panel as an example. The other steps for producing the solar cell panel are substantially the same as those described for the first embodiment, and their description is therefore omitted.

The first cell layer 91 is formed using the same steps as the second embodiment, by sequentially depositing the amorphous silicon p-layer 31, the amorphous silicon i-layer 32, and the n-layer 33 comprising mainly P-doped silicon in which microcrystalline silicon is incorporated within amorphous silicon. In this embodiment, the thickness of the p-layer 31 is not less than 10 nm and not more than 30 nm, the thickness of the i-layer 32 is not less than 200 nm and not more than 350 nm, and the thickness of the n-layer 33 is not less than 30 nm and not more than 50 nm.

For the second cell layer 92, the crystalline silicon p-layer 41 and the crystalline silicon i-layer 42 are deposited using the same steps as the first embodiment. Subsequently, the crystalline silicon n-layer 45 is deposited under conditions including a reduced pressure atmosphere of not more than 3,000 Pa, a substrate temperature of approximately 200° C., and a frequency of not less than 30 MHz and not more than 100 MHz. In this embodiment, the thickness of the p-layer 41 is not less than 10 nm and not more than 50 nm, the thickness of the i-layer 42 is not less than 1.2 μm and not more than 3 μm, and the thickness of the n-layer 45 is not less than 10 nm and not more than 50 nm.

For the third cell layer 93, the crystalline silicon p-layer 61 is deposited using the same steps as the first embodiment. Subsequently, a crystalline silicon germanium i-layer 62 is deposited by introducing $SiH_4$ gas, $GeH_4$ gas and $H_2$ gas as raw material gases under conditions including a reduced pressure atmosphere of not more than 3,000 Pa, a substrate temperature of approximately 200° C., and a plasma generation frequency of not less than 40 MHz and not more than 100 MHz. The nitrogen-containing n-layer 63 and the interface treatment layer 64 are then deposited sequentially in the same manner as the first embodiment.

The thickness of the p-layer 61 of the third cell layer 93 is not less than 10 nm and not more than 50 nm, the thickness of the i-layer 62 is not less than 1 μm and not more than 3 μm, the thickness of the nitrogen-containing n-layer 63 is not less than 10 nm and not more than 50 nm, and the thickness of the interface treatment layer 64 is not less than 1 nm and not more than 3 nm.

In the third embodiment, the relationship between the $N_2$ gas concentration and the nitrogen atomic concentration within the nitrogen-containing n-layer, the relationship between the nitrogen atomic concentration within the nitrogen-containing n-layer and the crystallization ratio, and the relationship between the nitrogen atomic concentration within the nitrogen-containing n-layer and the open-circuit voltage of the solar cell module exhibited the same tendencies as those observed for the first embodiment.

In this embodiment, as was the case for the first and second embodiments, forming the nitrogen-containing n-layer enabled the open-circuit voltage to be increased. Furthermore, forming the interface treatment layer lowered the series resistance Rs and suppressed variation in the resistance value, meaning the fill factor could be stabilized at a high value. In this manner, the effects of the nitrogen-containing n-layer and the interface treatment layer were confirmed even within triple solar cells.

Fourth Embodiment

A description of the structure of a photovoltaic device according to a fourth embodiment of the present invention is presented below.

Figure 24:
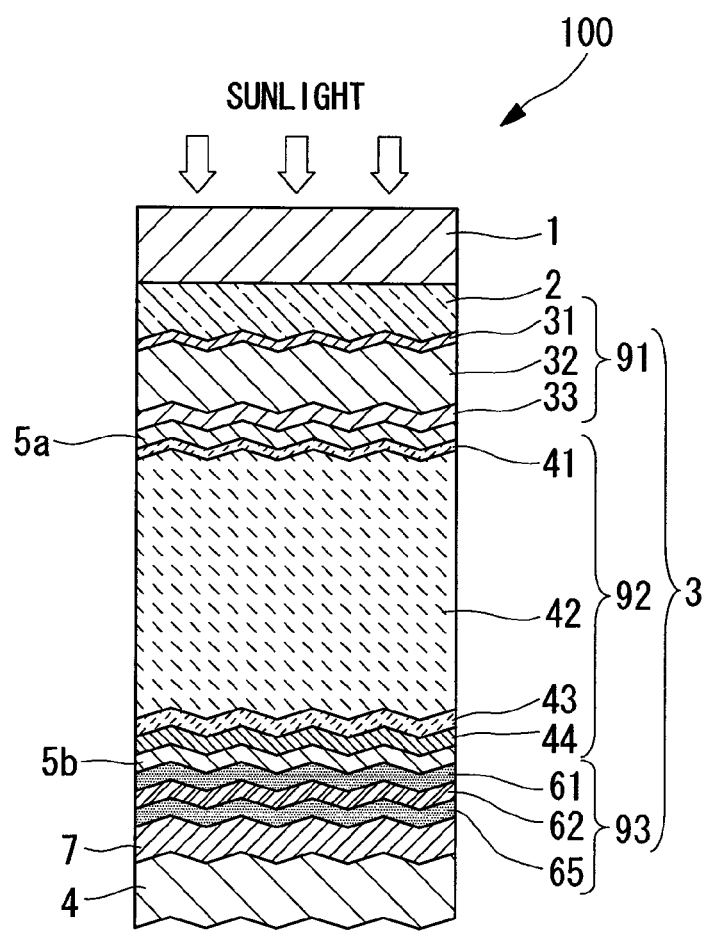
FIG. 24 A cross-sectional view schematically illustrating the structure of a photovoltaic device according to a fourth embodiment of the present invention.

FIG. 24 is a schematic illustration of the structure of a photovoltaic device according to the fourth embodiment. This photovoltaic device 100 is a triple silicon-based solar cell. The photovoltaic layer 3 comprises a first cell layer 91, a second cell layer 92 and a third cell layer 93 stacked in that order on the substrate 1. The first cell layer 91 comprises a p-layer 31, an i-layer 32 and an n-layer 33, each composed of a thin film of amorphous silicon, stacked in that order from the sunlight-incident side of the device. The second cell layer 92 comprises a p-layer 41, an i-layer 42, a nitrogen-containing n-layer 43 and an interface treatment layer 44 stacked in that order from the sunlight-incident side of the device. The third cell layer 93 comprises a p-layer 61, an i-layer 62 and an n-layer 65 stacked in that order from the sunlight-incident side of the device. Intermediate contact layers 5a and 5b are provided between the first cell layer 91 and the second cell layer 92, and between the second cell layer 92 and the third cell layer 93 respectively. A back-side transparent electrode layer 7 and a back electrode layer 4 are stacked in order on the opposite side of n-layer 65 of the third cell layer to the sunlight-incident side.

A description of the steps for forming the photovoltaic layer of a photovoltaic device according to the fourth embodiment is presented below, using a solar cell panel as an example. The other steps for producing the solar cell panel are substantially the same as those described for the first embodiment, and their description is therefore omitted.

The first cell layer 91 is formed in the same manner as the third embodiment.

For the second cell layer 92, the crystalline silicon p-layer 41, the crystalline silicon i-layer 42, the nitrogen-containing n-layer 43, and the interface treatment layer 44 are deposited sequentially using the same steps as the second embodiment. In this embodiment, the thickness of the p-layer 41 is not less than 10 nm and not more than 50 nm, the thickness of the i-layer 42 is not less than 1.2 μm and not more than 3 μm, the thickness of the nitrogen-containing p-layer 43 is not less than 10 nm and not more than 50 nm, and the thickness of the interface treatment layer 44 is not less than 1 nm and not more than 3 nm.

The third cell layer 93 is formed using the same steps as those employed for the second cell layer of the third embodiment. In this embodiment, the thickness of the p-layer 61 is not less than 10 nm and not more than 50 nm, the thickness of the i-layer 62 is not less than 1 μm and not more than 3 μm, and the thickness of the n-layer 65 is not less than 10 nm and not more than 50 nm.

In the fourth embodiment also, the relationship between the $N_2$ gas concentration and the nitrogen atomic concentration within the nitrogen-containing n-layer, the relationship between the nitrogen atomic concentration within the nitrogen-containing n-layer and the crystallization ratio, and the relationship between the nitrogen atomic concentration within the nitrogen-containing n-layer and the open-circuit voltage of the solar cell module exhibited the same tendencies as those observed for the first embodiment.

Figure 25:
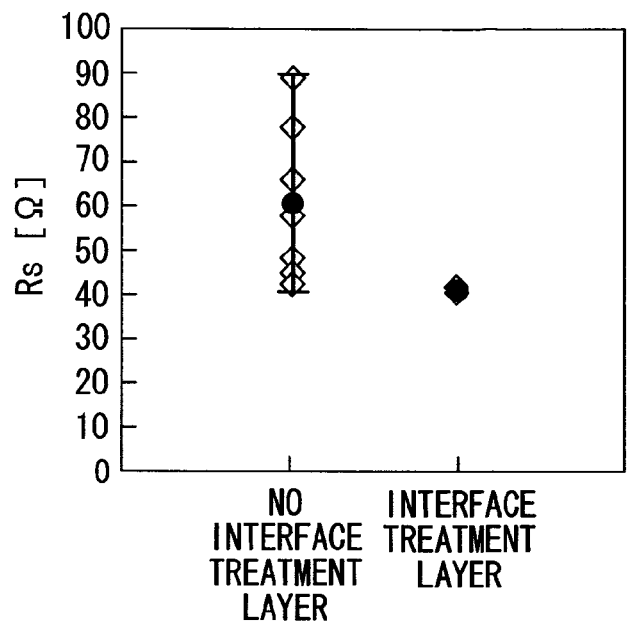
FIG. 25 A graph illustrating the distribution in the series resistance of a solar cell depending on the existence or absence of an interface treatment layer in the fourth embodiment.
Figure 26:
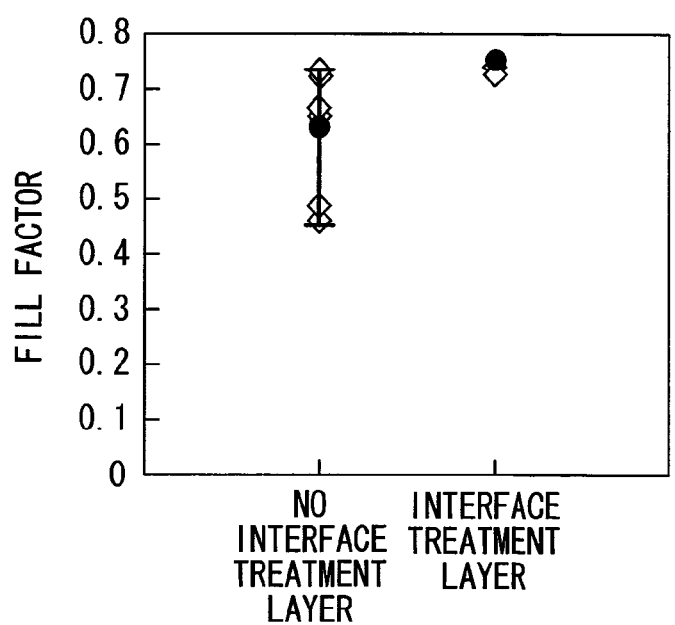
FIG. 26 A graph illustrating the distribution in the fill factor for a solar cell depending on the existence or absence of an interface treatment layer in the fourth embodiment.

The distributions in the series resistance and the fill factor across a plurality of solar cells comprising an interface treatment layer and a plurality of solar cells having no interface treatment layer are illustrated in FIG. 25 for the series resistance and FIG. 26 for the fill factor. Using the deposition conditions described above, the first cell layer was formed with a p-layer thickness of 8 nm, an i-layer thickness of 300 nm, and an n-layer thickness of 40 nm. The deposition conditions for the second cell layer were the same as those described for the first embodiment. The third cell layer was formed with a p-layer thickness of 30 nm, an i-layer thickness of 2 μm, and an n-layer thickness of 30 nm.

In this embodiment also, the solar cells having an interface treatment layer had a lower series resistance Rs and minimal variation in the resistance value, meaning the fill factor could be stabilized at a high value. This means that triple solar cells of high conversion efficiency can be obtained with good stability.

Figure 27:
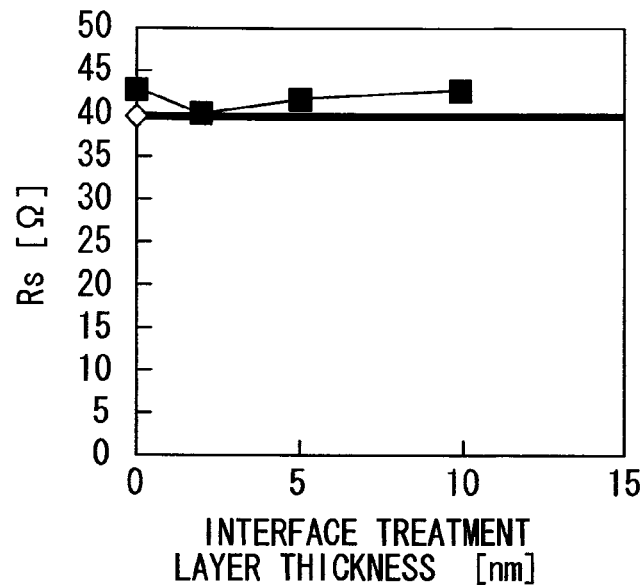
FIG. 27 A graph illustrating the relationship between the interface treatment layer thickness and the series resistance of the solar cell in the fourth embodiment.
Figure 28:
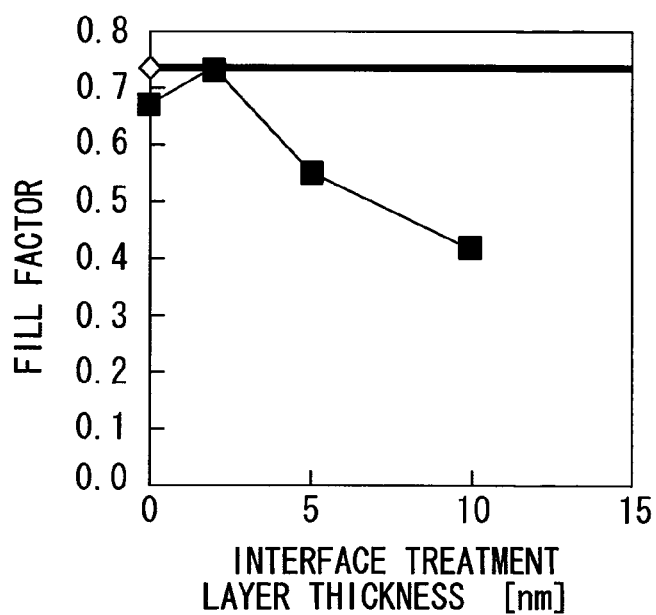
FIG. 28 A graph illustrating the relationship between the interface treatment layer thickness and the fill factor for the solar cell in the fourth embodiment.
Figure 29:
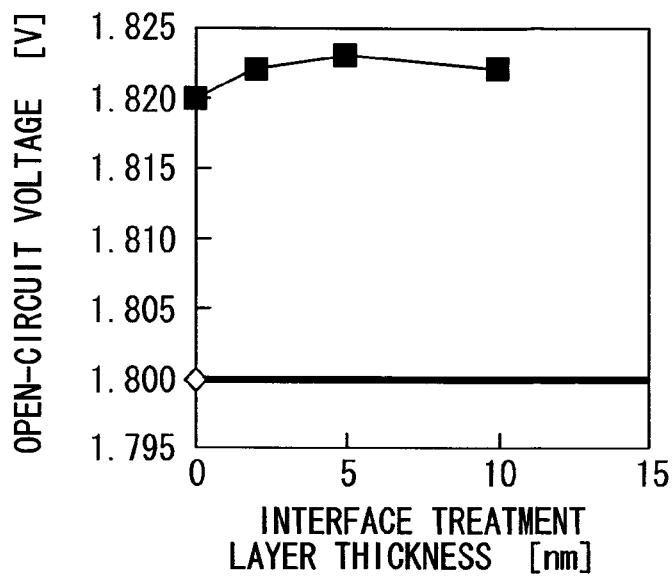
FIG. 29 A graph illustrating the relationship between the interface treatment layer thickness and the open-circuit voltage for the solar cell in the fourth embodiment.
Figure 30:
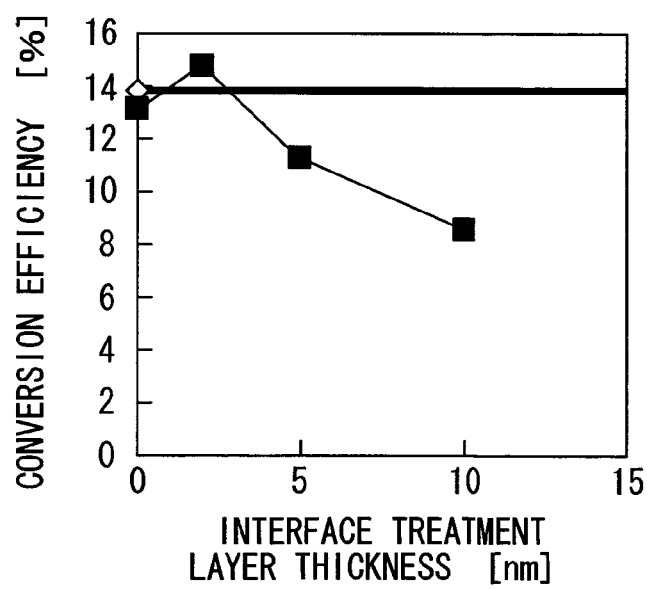
FIG. 30 A graph illustrating the relationship between the interface treatment layer thickness and the photovoltaic conversion efficiency for the solar cell in the fourth embodiment.

The relationships between the interface treatment layer thickness and the series resistance (FIG. 27), the fill factor (FIG. 28), the open-circuit voltage (FIG. 29) and the conversion efficiency (FIG. 30) of the solar cell are illustrated in the indicated figures. In each figure, the horizontal axis represents the thickness of the interface treatment layer. The vertical axis represents the series resistance in FIG. 27, the fill factor in FIG. 28, the open-circuit voltage in FIG. 29, and the solar cell conversion efficiency in FIG. 30. The conditions for formation of each of the layers, with the exception of the thickness of the interface treatment layer, were the same as those for the solar cells of FIG. 25 and FIG. 26. In each of the figures, the solid horizontal line represents the value for a conventional solar cell having an n-layer that comprises no nitrogen (and no interface treatment layer).

In the case of an interface treatment layer thickness of 2 nm, the series resistance was lower and the fill factor was higher than those of the other solar cells. The open-circuit voltage improved dramatically compared with a conventional solar cell as a result of the formation of the nitrogen-containing n-layer. The solar cell in which the interface treatment layer had a thickness of 2 nm exhibited improved photovoltaic conversion efficiency when compared with a conventional solar cell or a solar cell having no interface treatment layer. From the results in FIG. 27 and FIG. 28 it can be stated that an improvement in the fill factor is obtained when the thickness of the interface treatment layer is not less than 1 nm and not more than 3 nm.

As described above, in those cases where an interface treatment layer is formed between the nitrogen-containing p-layer and the intermediate contact layer, an improvement in the open-circuit voltage due to the nitrogen-containing p-layer, and an improvement in the fill factor due to an improvement in the contact properties provided by the interface treatment layer can be achieved.

The invention claimed is:

1. A photovoltaic device comprising a photovoltaic layer and a back-side transparent electrode layer, the photovoltaic layer having a p-layer, an i-layer and an n-layer stacked on top of a substrate, wherein
the n-layer comprises a nitrogen-containing n-layer, and an interface treatment layer formed on an opposite surface of the nitrogen-containing n-layer to the substrate,
the nitrogen-containing n-layer comprises nitrogen atoms at an atomic concentration of not less than 1% and not more than 20%, and has a crystallization ratio of not less than 0 but less than 3,
the interface treatment layer contacts the back-side transparent electrode layer, and
the interface treatment layer has a crystallization ratio of not less than 1 and not more than 6, and has a conductivity of not less than 1 S/cm and not more than 100 S/cm.

2. The photovoltaic device according to claim 1, wherein a thickness of the interface treatment layer is not less than 1 nm and not more than 3 nm.

3. The photovoltaic device according to claim 1, wherein the i-layer is a crystalline intrinsic semiconductor.

4. The photovoltaic device according to claim 2, wherein the i-layer is a crystalline intrinsic semiconductor.

* * * * *